(12) United States Patent
Lee et al.

(10) Patent No.: US 12,334,714 B2
(45) Date of Patent: Jun. 17, 2025

(54) VISIBLE LIGHT-EMITTING DEVICE AND LASER WITH IMPROVED TOLERANCE TO CRYSTALLINE DEFECTS AND DAMAGE

(71) Applicant: The Board of Trustees of the University of Illinois, Urbana, IL (US)

(72) Inventors: Minjoo Lawrence Lee, Urbana, IL (US); Pankul Dhingra, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 433 days.

(21) Appl. No.: 17/751,335

(22) Filed: May 23, 2022

(65) Prior Publication Data
US 2022/0376477 A1 Nov. 24, 2022

Related U.S. Application Data

(60) Provisional application No. 63/191,752, filed on May 21, 2021.

(51) Int. Cl.
*H01S 5/343* (2006.01)
*H10H 20/812* (2025.01)

(52) U.S. Cl.
CPC .......... *H01S 5/3432* (2013.01); *H01S 5/3436* (2013.01); *H10H 20/812* (2025.01)

(58) Field of Classification Search
CPC ....... H01S 5/3432; H01S 5/3436; H01L 33/06
USPC .......................................................... 257/14
See application file for complete search history.

(56) References Cited

U.S. PATENT DOCUMENTS

2008/0268288 A1* 10/2008 Jin .................. B82Y 40/00
427/259
2016/0336480 A1* 11/2016 Nishi ................. H01L 33/08

OTHER PUBLICATIONS

Garcia, J.M. et al., "Intermixing and shape changes during the formation of InAs self-assembled quantum dots," Appl. Phys. Lett., 71(14), 2014-2016, 1997 (4 pages).
Jung, D. et al., "Highly Reliable Low-Threshold InAs Quantum Dot Lasers on On-Axis (001) Si with 87% Injection Efficiency," ACS Photonics, 5(3), 1094-1100, 2018 (7 pages).
Wang, T. et al., "1.3μm InAs/GaAs quantum-dot lasers monolithically grown on Si substrates," Opt. Express, 19(12), 11381-11386, 2011 (6 pages).
Al-Ghamdi, M.S. et al., "Absorption, Gain, and Threshold in InP/AlGaInP Quantum Dot Laser Diodes," IEEE J. Quantum Electron., 49(4), 389-394, 2013 (6 pages).
Zhao, H.-Q. et al., "Thermal stress analysis for GaInAsP multiple quantum well wafer chemically bonded to Si (100)," J. Appl. Phys., 100(2), 023513, 2006 (9 pages).
Enatsu, M. et al., "Photoluminescence study of GaAs grown directly on Si substrates," Jpn. J. Appl. Phys., Part 2, 26(9), L1468-L1471, 1987 (4 pages).
Liu, H. et al., Long-wavelength InAs/GaAs quantum-dot laser diode monolithically grown on Ge substrate, Nat. Photonics, 5(7), 416-419, 2011 (4 pages).

(Continued)

*Primary Examiner* — Tu-Tu V Ho
(74) *Attorney, Agent, or Firm* — Benesch Friedlander Coplan & Aronoff LLP

(57) ABSTRACT

Visible spectrum quantum dot (QD) light emitting sources integrable with integrated silicon photonics include a plurality of epitaxially grown InP QDs within an active region. The light emitting sources include light emitting diodes (LEDs) and semiconductor lasers.

19 Claims, 18 Drawing Sheets

(56) References Cited

OTHER PUBLICATIONS

Dhingra, P. et al., "InP quantum dots for dislocation-tolerant, visible light emitters on Si," Appl. Phys. Lett. 117, 181102, 2020 (6 pages).
Lim, A.E. et al., "Review of Silicon Photonics Foundry Efforts," IEEE J. Sel. Top. Quantum Electron, 20(4), 405-416 (2014) (12 pages).
Zhou, Z. et al., "Silicon Photonics for Advanced Optical Interconnections," J. Lightwave Technol., 33(4), 928-933, 2015 (6 pages).
Bowers, J. et al., "Recent advances in silicon photonic integrated circuits," Proc. SPIE 9774, 977402, 2016 (19 pages).
Jung, D. et al., "Low threading dislocation density GaAs growth on on-axis GaP/Si (001)," J. Appl. Phys., 122(22), 225703, 2017 (8 pages).
Stintz, A. et al., "Characterization of InAs quantum dots in strained InxGa1-xAs quantum wells," J. Vac. Sci. Technol., B, 18(3), 1496-1501, 2000 (7 pages).
Ustinov, V.M. et al., InAs/InGaAs quantum dot structures on GaAs substrates emitting at 1.3 μm, Appl. Phys. Lett., 74(19), 2815-2817, 1999 (4 pages).
Norman, J.C. et al., "Perspective: The future of quantum dot photonic integrated circuits," APL Photonics 3(3), 030901, 2018 (21 pages).
Zhou, Z. et al., "On-chip light sources for silicon photonics," Light Sci. Appl., 4, e358, 2018 (13 pages).
Tanriseven, S. et al., "Low effective surface recombination in In(Ga)As/GaAs quantum dot diodes," J. Appl. Phys., 110(3), 034508, 2011 (7 pages).
Moore, S.A. et al., "Reduced Surface Sidewall Recombination and Diffusion in Quantum-Dot Lasers," IEEE Photonic Tech. Lett., 18(17), 1861-1863 (3 pages).
Liu, Z. et al., "Origin of Defect Tolerance in InAs/GaAs Quantum Dot Lasers Grown on Silicon," J. Lightwave Technol., 38(2), 240-248, 2020 (9 pages).
Liu, A.Y. et al., "Quantum dot lasers for silicon photonics [Invited]," Photonics Res. 3(5), B1-B9, 2015 (9 pages).
Hiuang, X. et al., "InGaAs/GaAs quantum well lasers grown on exact GaP/Si (001)," Electron. Lett., 50(17), 1226-1227, 2014 (3 pages).
Dery, H. et al., "On the nature of quantum dash structures," J. Appl. Phys., 95(11), 6103-6111, 2004 (10 pages).
Rossbach, R. et al., "Red to green photoluminescence of InP-quantum dots in AlxGa1-xInp," J. Cryst. Growth, 298, 595-598, 2007 (4 pages).
Briggs, A.F. et al., "Mid-infrared electroluminescence from type-II In(Ga)Sb quantum dots," Appl. Phys. Lett, 116(6), 061103, 2020 (6 pages).
Jung, D. et al., "Recent Advances in InAs Quantum Dot Lasers Grown on On-Axis (001) Silicon by Molecular Beam Epitaxy," Phys. Status Solidi A, 216(1), 1800602, 2019 (5 pages).
Xue, Y. et al., "1.55 μm electrically pumped continuous wave lasing of quantum dash lasers grown on silicon," Opt. Express, 28(12), 18172, 2020 (8 pages).
Busskamp, V. et al., "Genetic Reactivation of Cone Photoreceptors Restores Visual Responses in Retinitus Pigmentosa," Science, 329(5990), 413-417, 2010 (8 pages).
Madisen, L. et al., "A toolbox of Cre-dependent optogenetic transgenic mice for light-induced activation and silencing," Nat. Neurosci., 15(5), 793-802, 2012 (12 pages).
Geuzebroek, D. et al., "Potonics Packaging Made Visible: Scalable assembly and packaging of photonic integrated circuits for emerging applications," Optik Photonik, 12(b), 34-38, 2017 (5 pages).
Horng, R. et al., "Development and Fabrication of AlGaInP-Based Flip-Chip Micro-LEDs," IEEE J. Electron Devices Soc., 6, 475-479, 2018 (5 pages).
Yadavalli, K. et al., "Monolithic and heterogeneous integration of RGB micro-LED arrays with pixel-level optics array and CMOS image processor to enable small form-factor display applications," Proc. SPIE, 11310, 113100Z, 2020 (11 pages).

Margolis, H.S. et al., "Hertz-Level Measurement of the Optical Clock Frequency in a Single 88Sr+ Ion," Science, 306(5700), 1355-1358, 2004 (5 pages).
Mehta, K.K. et al., "Integrated optical addressing of an ion qubit," Nat. Nanotechnol., 11(12), 1066-1070, 2016 (6 pages).
Lutti, J. et al., "740 nm InP/GaInP quantum-dot laser with 190 A cm-2 room temperature threshold current density," Electron. Lett., 41(5), 247-248, 2005 (2 pages).
Shutts, S. et al., "Dual-wavelength InP quantum dot lasers," Appl. Phys. Lett., 104(24), 241106, 2014 (5 pages).
Walter, G. et al., "Visible spectrum (645 nm) transverse electric field laser operation of InP quantum dots coupled to tensile strained In0.46Ga0.54P quantum wells," Appl. Phys. Lett., 84(5), 666-668, 2004 (4 pages).
Schulz, W.M. et al., "Low Threshold InP/AlGaInP Quantum Dot In-Plane Laser Emitting at 638 nm," Appl. Phys. Express, 2(11), 112501, 2009 (4 pages).
Karomi, I. et al., "InAsP quantum dot lasers grown by MOVPE," Opt. Express, 23(21), 27282-27291, 2015 (10 pages).
Volz, K. et al., "GaP-nucleation on exact Si (001) substrates for III/V device integration," J. Cryst. Growth, 315(1), 37-47, 2011 (11 pages).
Simon, J. et al., "Metamorphic GaAsP buffers for growth of wide-bandgap InGaP solar cells," J. Appl. Phys., 109(1), 013708, 2011 (7 pages).
Jalonen, M. et al., "Effects of rapid thermal annealing on GaInP/AlGaInP lasers grown by all-solid-source molecular beam epitaxy," Appl. Phys. Lett., 71(4), 479-481, 1997 (4 pages).
Huang, Z. et al., "Optical Gain and Lasing Properties of InP/AlGaInP Quantum-Dot Laser Diode Emitting at 660 nm," IEEE J. Quantum Electron., 55(2), 1-7, 2019 (7 pages).
Zhang, X.B. et al., "Effect of the InAlGaP matrix on the growth of self-assembled InP quantum dots by metalorganic chemical vapor deposition," Appl. Phys. Lett., 83(7), 1349-1351, 2003 (4 pages).
Lutti, J., "Optical properties of InP/AlGaInP quantum dot laser hetero-structures," Ph.D. thesis, Cardiff University, 2005 (129 pages).
Katmis, A.U., "Growth and characterization of InP/In0.48Ga0.52P quantum dots optimized for single-photon emission," Ph.D. thesis, Humboldt-Universität zu Berlin, Mathematisch-Naturwissenschaftliche Fakultät I, 2013 (106 pages).
Zhang, X.H. et al., "Band offsets at GaInP/AlGaInP(001) heterostructures lattice matched to GaAs," Appl. Phys. Lett., 73(8), 1098-1100, 1998 (4 pages).
Eberl, K. et al., "Self-assembling InP quantum dots for red lasers," J. Cryst. Growth, 175-176, 702-706, 1997 (5 pages).
Shutts, S. et al., "Exploring the wavelength range of InP/AlGaInP QDs and application to dual-state lasing," Semicond. Sci. Technol., 30(4), 044002, 2015 (9 pages).
Selvidge, J. et al., "Non-radiative recombination at dislocations in InAs quantum dots grown on silicon," Appl. Phys. Lett., 115(13), 131102, 2019 (6 pages).
Selvidge, J. et al., "Defect filtering for thermal expansion induced dislocations in III-V lasers on silicon," Appl. Phys. Lett., 117(12), 122101, 2020 (7 pages).
Mukherjee, K. et al., "Recombination-enhanced dislocation climb in InAs quantum dot lasers on silicon," J. Appl. Phys., 128(2), 025703, 2020 (12 pages).
Zou, J. et al., "Transmission electron microscopy study of InxGa1-xAs quantum dots on a GaAs(001) substrate," Phys. Rev. B 59(19), 12279-12282, 1997 (4 pages).
Wu, W. et al., "Atom-resolved scanning tunneling microscopy of vertically ordered InAs quantum dots," Appl. Phys. Lett., 71(8), 1083-1085, 1997 (4 pages).
Manz, Y.M. et al., "Room-temperature lasing via ground state of current-injected vertically aligned InP/GaInP quantum dots," Appl. Phys. Lett., 76(23), 3343-3345, 2000 (4 pages).
Smowton, P.M. et al., "InP-GaInP Quantum-Dot Lasers Emitting Between 690-750 nm," IEEE J. Sel. Top. Quantum Electron., 11(5), 1035-1040, 2005 (6 pages).
Schulz, W.M. et al., "Optical and structural properties of InP quantum dots embedded in (AlxGa1-x)0.51In0.449P," Phys. Rev. B 79(3), 035329, 2009 (8 pages).

(56) References Cited

OTHER PUBLICATIONS

Saito, H. et al., "Shape transition of InAs quantum dots by growth at high temperature," Appl. Phys. Lett., 74(9), 1224-1226, 1999 (4 pages).

* cited by examiner

VISIBLE LIGHT-EMITTING DEVICE AND LASER WITH IMPROVED TOLERANCE TO CRYSTALLINE DEFECTS AND DAMAGE

STATEMENT OF FEDERALLY FUNDED RESEARCH OR SPONSORSHIP CROSS REFERENCE TO RELATED APPLICATIONS

The present application claims the benefit of priority under 35 U.S.C. § 119 from U.S. Provisional Patent Application Ser. No. 63/191,752, entitled "Visible Light-Emitting Device with Improved Tolerance to Crystalline Defects and Damage," filed on May 21, 2021, the disclosure of which is hereby incorporated by reference in its entirety for all purposes.

TECHNICAL FIELD

The present disclosure generally relates to light emission sources, including light-emitting devices and lasers, and more specifically relates to light-emitting devices and lasers with improved tolerance to crystalline defects and damage.

BACKGROUND

Light emission sources, including light-emitting devices (LEDs) and lasers, have been fabricated using semiconductor materials for a wide variety of applications. For example, light-emitting diodes (LEDs) have been used in lighting and video display applications. LEDs typically provide advantages over other technologies in energy efficiency, color accuracy, and useful life. Video display panels using LEDs as individually addressable pixels may increase image resolution by integrating more LEDs within a given spatial area on the display panels. LEDs may be used for displays in mobile telephones, wearable devices such as watches and fitness trackers, virtual/augmented reality glasses and/or goggles, micro-projectors, and high definition (HD) television (TV) sets. In addition, semiconductor lasers have been used in applications including data communications, remote sensing, and video displays, for example.

SUMMARY

According to certain aspects of the present disclosure, a light emission source includes an active region having a plurality of InP quantum dots (QDs) epitaxially grown therein, in which the active region is operable to convert electrical current into light emission. A first barrier layer is grown below the active region, and a second barrier layer is grown on top of the active region. A first carrier blocking layer may be grown below the first barrier layer, and a second carrier blocking layer may be grown on top of the second barrier layer. A first carrier blocking layer may be grown below the first barrier layer. A GaAs buffer layer may be grown below the first carrier blocking layer, and at least one of a GaAs or GaAs/Si layer may be grown below the GaAs buffer layer. At least one of the GaAs or GaAs/Si layer may be grown on a surface of a Si substrate. The Si substrate may include electrical circuitry for supplying electrical current to the light emission source. The QDs may include between two (2) and four (4), inclusive, monolayer InP QDs. The active region may include an InGaP quantum well (QW) that caps the InP QDs. The QDs may be disposed within an active region of an AlGaInP LED configured to emit light within a visible spectral range. The QDs may be disposed within an active region of an InP laser configured to emit light within a visible spectral range. A GaAs capping layer may be grown above the second carrier blocking layer, an AlGaInP layer may be disposed above the GaAs capping layer, and more than one InP quantum dots (QDs) may be epitaxially grown on the AlGaInP layer.

According to certain aspects of the present disclosure, a method of manufacturing a visible-wavelength light emission source includes epitaxially growing a GaAs buffer layer on at least one of a GaAs layer or a GaAs/Si layer, epitaxially growing a carrier blocking layer on top of the GaAs buffer layer, epitaxially growing a first barrier layer above the carrier blocking layer, and epitaxially growing a plurality of InP quantum dots within an active region operable to convert electrical current into light emission. The method may further include epitaxially growing a second barrier layer on top of the active region. The method may also include epitaxially growing a second carrier blocking layer on top of the second barrier layer. The method may also include epitaxially growing a GaAs capping layer on top of the second carrier blocking layer. The method may also include epitaxially growing an AlGaInP layer on top of the GaAs capping layer, and epitaxially growing a plurality of InP QDs on top of the AlGaInP layer. The method may also include growing the at least one of the GaAs or GaAs/Si layer on a surface of a Si substrate, wherein the Si substrate includes electrical circuitry for supplying electrical current to the light emission source. The method may also include growing the QDs as between two (2) and four (4), inclusive, monolayer InP QDs. The active region may include an InGaP quantum well (QW) that caps the InP QDs. The QDs may be grown within an active region of an AlGaInP LED configured to emit light within a visible spectral range. The QDs may be grown within an active region of an InP laser configured to emit light within a visible spectral range.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF DRAWINGS

The disclosure is better understood with reference to the following drawings and description. The elements in the figures are not necessarily to scale, emphasis instead being placed upon illustrating the principles of the disclosure. Moreover, in the figures, like-referenced numerals may designate to corresponding parts throughout the different views.

FIG. 17A shows that the exemplary red and far-red lasers achieved low-$J_{th}$ operation on both GaAs and GaAs/Si substrates.

Figure 1:
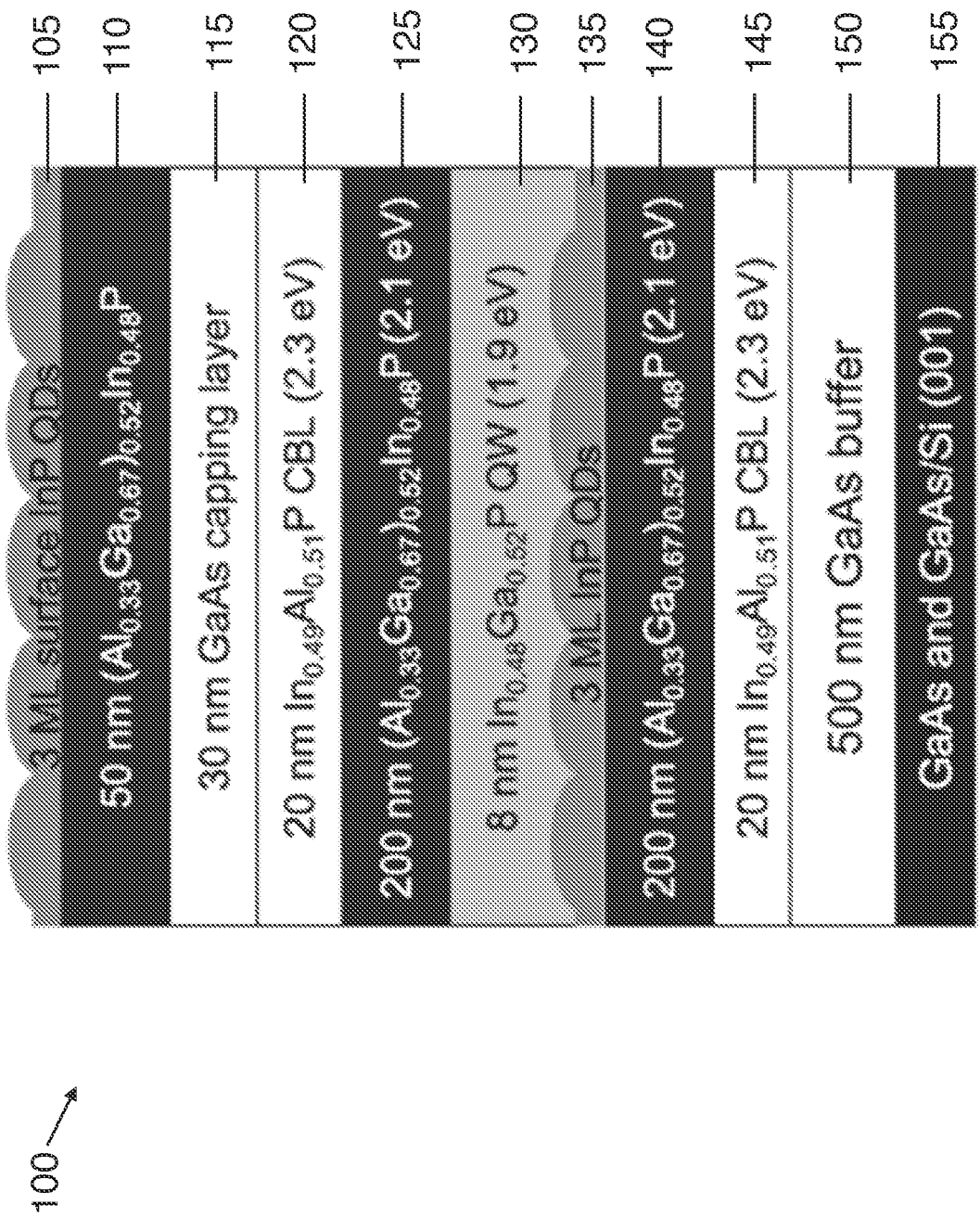
FIG. 1 illustrates an exemplary schematic diagram of QD PL structures co-grown on GaAs and GaAs/Si (001) substrates 155 with a 500 nm thick GaAs buffer layer 150 thereon.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive. Furthermore, while the examples described herein are made with reference to LEDs having a visible light emission in the EM spectrum associated with the color red, the examples should not be considered limiting, as the concepts and teachings of the present disclosure are also applicable to LEDs having other emission wavelengths, for example, within orange, yellow, green, blue, other visible color wavelengths, or non-visible wavelengths such as infrared wavelengths.

The disclosed technology provides LEDs that efficiently convert electrical charge into visible light emission when scaled down in size to lateral dimensions less than about fifty (50) micrometers on a side. Prior technologies, for example, red AlGaInP LEDs, become unsatisfactorily inefficient when scaled down to such small lateral dimensions. The inefficiencies of red AlGaInP LEDs, for example, may be due to sidewall damage and recombination. The prior red AlGaInP LED technology may use quantum wells in the active region. Disadvantages of the small etched features of these devices may include strong sidewall recombination due to charge carriers diffusing laterally to sidewalls. Epitaxial InP quantum dots of the disclosed technology may prevent lateral carrier diffusion to defects. The inefficiencies in prior LED technologies (e.g., red LED technologies) may make them unsuitable for use in microLED displays, for example.

The disclosed technology may provide LEDs that are highly stable and offer high internal quantum efficiency, for example, 80-100%. In contrast, prior technologies, for example, red organic LED (OLED) technology, may provide low quantum efficiency and have rapid device degradation.

The disclosed technology also provides LEDs that may be integrated or grown directly on silicon (Si) wafers and/or chips. Therefore, the disclosed LEDs may be interconnected with electronic circuits on the silicon wafers and/or chips, for example, active-matrix control electronics or silicon control electronics that control the disclosed LEDs. The disclosed LEDs may also be integrated with electronic circuits on the silicon wafers and/or chips for integrated photonics applications, for example, optical interconnects integrated with electronic circuitry, quantum computers, etc.

The disclosed technology also provides LEDs that may provide improved manufacturing yields over prior technologies, and therefore lower manufacturing costs and improved reliability. The disclosed LEDs may have improved yields due to their tolerance to defects, for example, broken bonds within the crystalline structure or regular lattice pattern of atoms of the semiconductor material in which the LED is fabricated. Examples of defects to which the disclosed LEDs may have tolerance without significant impact to light emission performance include dislocations and damage to the crystalline structure, as well as discontinuities in the crystalline structure caused by surfaces and/or sidewalls of the LED structure. Typically, crystalline defects may cause electrons that encounter them to generate heat instead of light emission in typical LEDs. In addition, as an LED is reduced in size, the surfaces and sidewalls of the LED structure become physically closer to more and more of the LED's operational region, thereby having a greater potential impact on electron-to-light conversion efficiency within the LED. However, due to their increased tolerance to crystalline defects as described below, the LEDs described herein may efficiently generate light emission in spite of the presence of crystalline defects and/or discontinuities within the semiconductor materials in which the LEDs are fabricated.

The disclosed technology also provides visible LEDs that may be incorporated into video displays, for example, visual displays of portable devices such as smartphones, smartwatches, augmented reality headsets and/or glasses, virtual reality goggles, personal digital assistants, pocket computers, etc.

Prior technologies that include InGaN-based or InGaN-based red LEDs to take advantage of lower surface recombination may provide a very low internal quantum efficiency and a strong phase separation of the highly strained InGaN active material. In contrast, quantum dots of the disclosed technologies may not undergo phase separation and may have a very high internal quantum efficiency.

Prior technologies that include conventional InGaN blue LEDs with a down-converting phosphor to provide red emission may have disadvantages of low speed and significant heat generation during the down-conversion process. In contrast, the disclosed technologies may operate with greater speed and reduced heat generation.

The disclosed technology provides improvements including, but not limited to, a new process for making light emitting Indium Phosphide quantum dots for red LEDs. The red LEDs produced using this new process may be highly tolerant to crystalline structure defects, relative to prior red LEDs, thereby facilitating the LEDs to be efficiently scaled to smaller sizes and to be grown on foreign substrates, for example, silicon, that may have imperfectly matched crystalline patterns relative to the crystalline patterns of the materials in which the LEDs are fabricated. The disclosed technology may also facilitate making LEDs of other colors, for example, orange and/or yellow. Prior standard red LEDs, in contrast to the red LEDs of the present disclosure, suffer from low efficiency and/or rapid degradation when scaled to smaller sizes and/or when attempted to be grown on foreign substrates such as silicon.

Using quantum dots (QDs) as the active regions for generating light emission may provide distributed light emission capabilities that become more tolerant to crystalline defects and discontinuities in the aggregate. Charge carriers injected into a QD may be trapped within the QD so that crystalline defects outside the QD do not negatively impact electron-to-photon conversion efficiency within the QD. For example, InP QDs epitaxially grown on Si may provide monolithic integration of visible-wavelength light sources on a Si photonics platform that is more tolerant to crystalline defects resulting from the crystalline lattice structure mismatch between the III-V crystal and the Si crystal. In contrast to quantum well (QW) lasers grown on Si, 1.3 µm InAs QD lasers grown on Si may have a similar threshold current as those grown on GaAs, for example, due to their better dislocation tolerance.

QDs used as the active regions for generating light emission may provide tolerance to the crystalline discontinuities of micro-LEDs as the micro-LEDs scale to smaller and smaller dimensions. This may be due to the distributed light emission capabilities of many isolated QDs within the micro-LED trapping electrical current injected therein so that the electrical current injected into a given QD does not encounter the surfaces and/or sidewalls of the micro-LEDs. Thus, although QDs that are situated very close to surfaces and sidewalls of the micro-LED may be negatively impacted by the defects of the surfaces and sidewalls, those QDs that are situated further from the surfaces and sidewalls may not be negatively impacted because the charge carriers may not encounter the defects and/or damage associated therewith and instead may be efficiently converted to photons within the active regions of the QDs. The vast majority of the QDs may be unaffected by the surfaces and sidewalls due to the large number of QDs situated within a single micro-LED, as facilitated by a large difference in dimensions between a micro-LED and the nanoscale dimensions of a QD.

Prior to the technologies disclosed herein, dislocation-tolerant QDs have focused on materials emitting electromagnetic radiation (EMR) or light at telecom wavelengths, as they are referred to in the art. The telecom wavelengths include approximately 800-900 nm and 1260-1675 nm. The technologies disclosed herein include InP QDs on Si that provide visible-wavelength emissions with photoluminescence (PL) intensity similar to their counterparts grown on GaAs despite relatively high threading dislocation density (TDD). In contrast, InGaP QWs that provide visible-wavelength emissions and that are grown on Si with the same TDD value may demonstrate a 9× degradation in PL intensity compared to QWs grown on GaAs. The dislocation tolerance of InP QDs may arise from their high density relative to TDD and/or the lateral carrier confinement that they provide. InP QDs on Si with bright PL may be advantageous for low-cost light emitters and integrated photonics applications, for example, applications involving monolithic red-light sources.

A primary application for silicon photonics technology to date has been integrated photonic transceivers for telecommunications where off-chip or hybrid-integrated InP-based lasers emitting in the C- or O-bands (~1.3 µm-1.6 µm) serve as the light source. Leveraging the CMOS foundry, silicon photonics may facilitate an increasing number of applications, including mapping and navigation, spectroscopy, and quantum communication. Applications that rely on visible lasers, such as biosensing, atomic clocks, and spatial mapping may benefit from technologies to generate, guide, and sense light on a chip. As another example, integrated photonics may help overcome limitations of free-space optics for trapped-ion quantum computing relying on 674 nm lasers to drive transitions in $^{88}Sr^+$ ion qubits. The technologies described herein to integrate visible light sources on silicon may complement low-loss $SiN_x$ waveguide technology as enablers for visible photonics chips.

The silicon photonics platform may utilize well-developed processes for fabrication of modulators, detectors, and both Si and SiN optical waveguides. Nevertheless, monolithic integration of light sources remains challenging. The 4% lattice mismatch between GaAs and Si materials may lead to a typical threading dislocation density (TDD) of approximately $10^6$-$10^8$ cm$^{-2}$, which may cause strong non-radiative recombination in GaAs epitaxially grown on Si through a crystal growth process. Performance of 1.3 μm InAs QD light emitters that are monolithically integrated on Si as light sources for silicon photonics has been significantly improving recently. Despite the high TDD, InAs quantum dot-in-a-well (QDWELL) active regions on GaAs/Si may show high luminescence efficiency comparable to growth on GaAs due to the lateral carrier confinement of the QDs; once captured by a QD, injected carriers may no longer be free to diffuse toward dislocations. QDs may also prevent carriers from diffusing to free surfaces, which may make them well-suited for micro-scale light emitting diodes (micro-LEDs) and lasers. In a typical QDWELL, the InAs QD density (QDD) may be about $5\times10^{10}$ cm$^{-2}$. Therefore, even when TDD is about $10^8$ cm$^{-2}$, QDs may out-compete the dislocations for capture of carriers and enable efficient radiative recombination. In contrast, InGaAs QWs grown on GaAs/Si with such high TDD may show about 10× reduction in luminescence intensity compared to QWs grown on bulk GaAs. InGaAs QW lasers may also suffer from an about 60× increase in threshold current density (JO when grown on Si, as compared to the about 2× increase for InAs QD lasers on Si.

Despite the fact that III-V QDs may be designed to emit light over wavelengths spanning from 0.6-6 μm, prior work on dislocation-tolerant QD emitters has focused on telecom wavelengths of 1.24-1.55 μm. Phosphide-based QDs integrated on Si emitting light in the visible and near infrared (NIR) range may have a wide variety of applications including integrated optogenetics, biophotonic sensing, low-cost monolithically integrated micro-LEDs, and quantum optics. InP QD lasers on GaAs with a high QDD of about $5\times10^{10}$ cm$^{-2}$ may operate with a low $J_{th}$ of about 190 A/cm$^2$, a high output power of >150 mW, and a high characteristic temperature of >69K. The emission wavelength of InP QDs on GaAs may be tunable from about 640 nm to 750 nm and may be extended to >800 nm by alloying with As to form InAsP QDs. Despite prior developments in the growth of InP QD active regions on GaAs, there have been no reports demonstrating dislocation-tolerant QD emitters in the visible-NIR wavelength regime on Si substrates at room temperature.

Monolithically combining silicon nitride (SiN$_x$) photonics technology with III-V active devices may open a broad range of on-chip applications spanning a wide wavelength range of approximately 400 nm to 4000 nm. With the development of nitride, arsenide, and antimonide lasers based on quantum well (QW) and quantum dot (QD) active regions, the wavelength palette of integrated III-V lasers on silicon currently spans approximately 400 nm to 11 μm with a gap in the red-wavelength regime of 630-750 nm prior to the work described in this disclosure. Electrically injected red lasers have not previously been demonstrated on exact Si (001), preventing visible integrated photonics from fully leveraging advances in high-performance SiN$_x$ passive optical components and Si photodetectors.

The present disclosure describes red In$_{0.6}$Ga$_{0.4}$P QW and far-red InP QD lasers monolithically grown on CMOS-compatible Si (001) substrates with continuous-wave (CW) operation at room temperature (RT). Despite a moderate increase in $J_{th}$ caused by threading dislocations, the visible lasers on Si (001) described herein compare favorably with earlier-reported devices based on similar active regions grown on GaAs (001). A low-threshold current density of 550 A/cm$^2$ and 690 A/cm$^2$ with emission at 680-730 nm was achieved for QW and QD lasers on silicon, respectively. The present disclosure demonstrates that electrically injected lasers incorporating InP QDs in their active region function well at room temperature despite crystalline imperfections, such as dislocations. In addition, the present disclosure illustrates that visible InP QD LEDs grown on Si would also function well at room temperature despite crystalline imperfections, at least because any laser diode essentially functions as an LED until the laser threshold condition is reached. The present disclosure describes progress toward integration of visible red lasers on silicon, facilitating the utilization of integrated photonics for applications including biophotonic sensing, quantum computing, and near-eye displays. Low-threshold, monolithically integrated visible lasers on silicon may serve as an important low-cost enabler for visible optoelectronics applications ranging from quantum information to near-eye displays.

Development of visible-wavelength emission InP QD-based LEDs described herein overcame challenges of using a different material system than the As-based material systems had been used in prior LEDs operating at telecom wavelengths. The challenges included growing crystals using phosphide materials plus integrating QD light emitting devices, for example, based on these phosphide materials, with silicon substrates.

Herein, we disclose InP QDs that provide visible-NIR wavelength emission on GaAs/Si substrates with TDD=$3.3\times10^7$ cm$^{-2}$ and that exhibit minimal degradation in photoluminescence (PL) intensity compared to samples grown on GaAs. In contrast, In$_{0.48}$Ga$_{0.52}$P (hereafter InGaP) QWs grown on GaAs/Si with similar TDD show a 9× reduction in PL intensity compared to QWs grown on GaAs. This may be because carriers captured in QWs are free to diffuse laterally to dislocations. The high dislocation tolerance of InP QDs compared to InGaP QWs may result from the four orders of magnitude higher QDD compared to TDD and/or the impeded carrier diffusivity due to the lateral confinement of the QDs.

All experimental samples described herein were grown by solid-source molecular beam epitaxy (MBE). However, in various implementations, crystal growth of devices as disclosed herein may be performed using other technologies, for example, metalorganic vapour-phase epitaxy (MOCVD). The disclosed LEDs may be grown and fabricated using any number of fabrication technologies capable of growing QDs within active regions of the LEDs.

In the experimental samples described herein, GaAs was grown on GaP/Si (001) templates that are available commercially from NaAsP$_{III-V}$ GmbH using a 4.3 μm thick GaAs$_y$P$_{1-y}$ step-graded buffer with a grading rate of 1%/μm. High-resolution x-ray diffraction (HRXRD) showed that the GaAs cap layer was about 100% relaxed at room temperature. GaAs/Si substrates were cleaved into several pieces and co-loaded with pieces of bulk GaAs for growth of QD and QW PL structures. Exemplary implementations of the disclosed light emitting devices were fabricated by growing PL active regions using a typical MBE growth window for indium-containing phosphide layers with a substrate temperature of 480° C., a V/III ratio of 10-30, and growth rates of about 0.2-0.5 μm/h. The QD samples had an additional layer of surface dots grown on top for atomic force microscopy (AFM), while the QW samples were capped with a thin 5 nm layer of GaAs to prevent oxidation of Al-containing layers. All phosphide layers were calibrated to be lattice-matched to GaAs through a combination of HRXRD and PL for quaternary compounds and through HRXRD for ternary compounds. The PL structures on both GaAs and GaAs/Si underwent post-growth rapid thermal annealing (RTA) in an AG 610 system at 700 C-1000 C for time between 1 s and 5 min to improve PL intensity, as is typical for MBE-grown phosphides. For QD samples, the surface InP and underlying AlGaInP layer were etched prior to RTA, exposing the GaAs capping layer (FIG. 1). For RTA experiments, the samples were placed on a Si wafer and covered with a GaAs wafer to prevent As desorption from the epitaxial GaAs capping layer. The RTA conditions were optimized using integrated PL intensity of the samples, with maximum enhancement in PL intensity for InP QDs and InGaP QWs observed at 750° C. for 5 min and 1000° C. for 1 s, respectively. The RTA conditions employed in the work described herein improved the PL intensity of both QDs and QWs without any significant shift in the emission wavelength.

A JEOL 2010F was used to conduct bright-field cross-sectional transmission electron microscopy (BF-XTEM) and an aberration-corrected JEOL 2200FS was used to conduct high-angle annular dark field (HAADF) scanning TEM (STEM) imaging, both at an accelerating voltage of 200 kV. Cathodoluminescence (CL) mapping of InP QD and InGaP QW samples was performed using a JEOL 7000F analytical scanning electron microscope at an accelerating voltage of 3 kV using a Gatan Mono CL system. Both CL and TEM studies were conducted on as-grown samples before RTA. After etching the GaAs capping layer and InP surface QDs, steady state PL at room-temperature using a 532 nm diode-pumped solid state laser with an incident power density of 5 W/cm² and an Ocean Optics spectrometer.

FIG. 1 illustrates an exemplary schematic diagram of QD PL structures 100 co-grown on GaAs and GaAs/Si (001) substrates 155 with a GaAs buffer layer 150 thereon. The GaAs buffer layer 150 may be approximately 500 nm thick, but this dimension is only an example. The buffer layer 150 may be any thickness sufficient to provide the buffer function, for example, 50 nm, 100 nm, 200 nm, up through 1 mm or more. Although the examples fabricated for measurements and discussed herein are illustrated and described with reference to specific dimensions and compositions, it should be understood that these dimensions and compositions are examples only, and that other dimensions and compositions may be employed without departing from the scope of the present disclosure. For example, various material composition for QD PL structures may include InAsP with As content ranging from about 0.01 to 0.99, or InGaAsP with In content greater than about 0.5 and P content greater than about 0.01. The dimensions of the QD may vary laterally from about 5 to 50 nm and vertically from about 1 to 8 nm, while the QD density may range from about $1 \times 10^8$ to $1 \times 10^{10}$ cm$^{-2}$. An exemplary operable LED may include, from top to bottom, a p-GaAs cap/contact element, a p-AlInP carrier blocking layer, a p-AlGaInP barrier layer, an undoped InGaP quantum well, a plurality of undoped InP QDs, an n-AlGaInP barrier layer, an n-AlInP carrier blocking layer, an n-GaAs buffer, and a GaAs or GaAs/Si substrate. The colors of the LEDs fabricated according to the disclosed technology may be changed, for example, from red to orange or yellow, by tuning the quantity of monolayers of InP, the composition of the quantum well, and/or the composition of the barriers in the device structure.

The QD PL structures 100 may include InP QDs that are epitaxially grown within an active region of an AlGaInP LED. These QDs may be highly tolerant of the presence of threading dislocations in the LED. This threading dislocation tolerance of the QDs may make such LEDs particularly efficient as red-wavelength light emitters to be grown on Si substrates, and may facilitate efficient use of light emitting InP QDs grown on GaAs that is grown on Si.

The surface InP QDs 105 and 50 nm thick AlGaInP layers 110 may be etched away prior to RTA, as they were in experiments described herein. The 30 nm thick GaAs capping layer 115 may be removed prior to PL experiments, as they were in the experiments described herein. The QD PL structures have three monolayer (ML) InP QDs 135 capped with an 8 nm 1.9 eV InGaP QW 130 and together surrounded by 200 nm thick, 2.1 eV $(Al_{0.33}Ga_{0.67})_{0.52}In_{0.48}P$ (hereinafter "AlGaInP") barriers 125, 140. The exemplary schematic diagram also illustrates 20 nm thick, 2.3 eV $In_{0.49}Al_{0.51}P$ carrier blocking layers (hereinafter "InAlP CBLs") 120, 145, above and below the active region to reduce surface recombination losses. All layers may be lattice-matched to GaAs except the InP QDs 135, which may have an approximately 3.7% compressive mismatch that may drive self-assembly via the Stranski-Krastanov mechanism. In addition, InGaP QW PL structures may be grown on both substrates with the same layer structure except without the InP QDs 135. Both the InP QD 135 and InGaP QWPL 130 structures may possess a type-I band alignment. Experimental results show that the calculated conduction and valence band offsets between InP and AlGaInP are $\Delta E_c=0.46$ eV and $\Delta E_v=0.23$ eV, respectively. For the InGaP and AlGaInP layers, the offsets are reduced to $\Delta E_c=0.13$ eV and $\Delta E_v=0.06$ eV, which is consistent with previously reported values. The ground state emission from the InP QDs 135 may blueshift by 0.4 eV from the bulk bandgap energy of InP, for example, due to both compressive strain and quantum confinement effects.

Figures 2A, 2B, 2C:
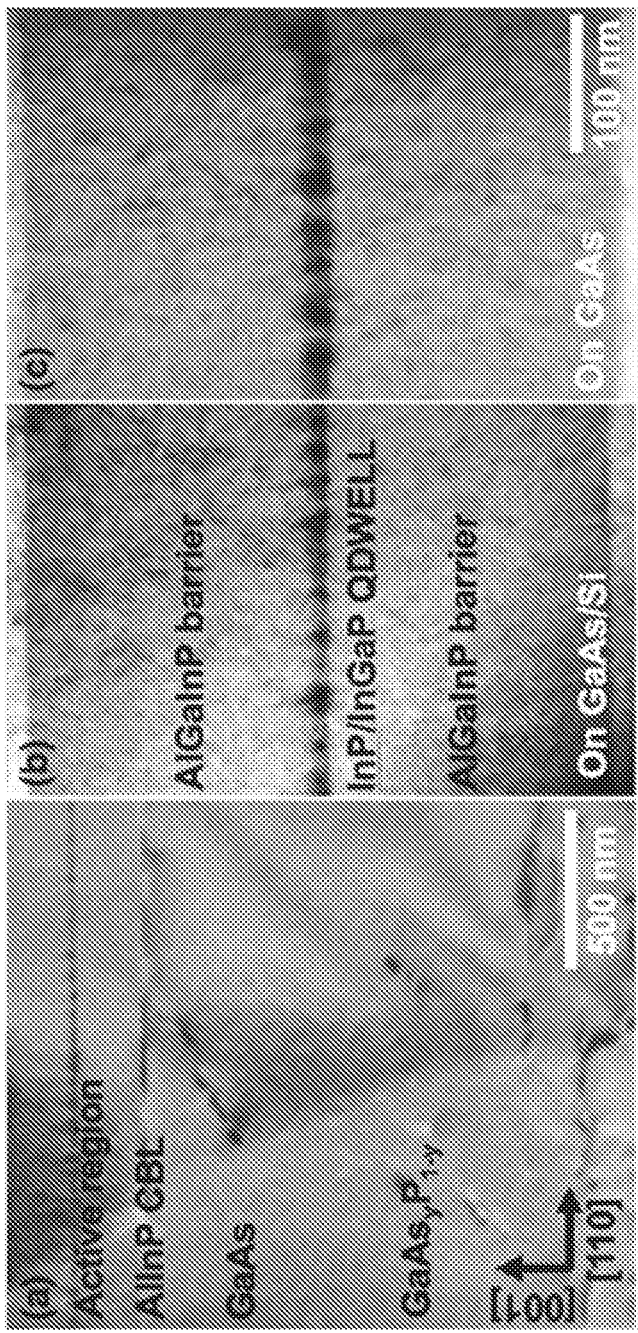
FIGS. 2(a) and 2(b) illustrate exemplary low-magnification (a) and high-magnification (b) XTEMs of an InP QD active region grown on GaAs/Si.
FIG. 2(c) illustrates an exemplary XTEM of InP QDs grown on GaAs showing a nearly identical morphology, in the same scale as shown in FIG. 2(b).
Figure 2D:
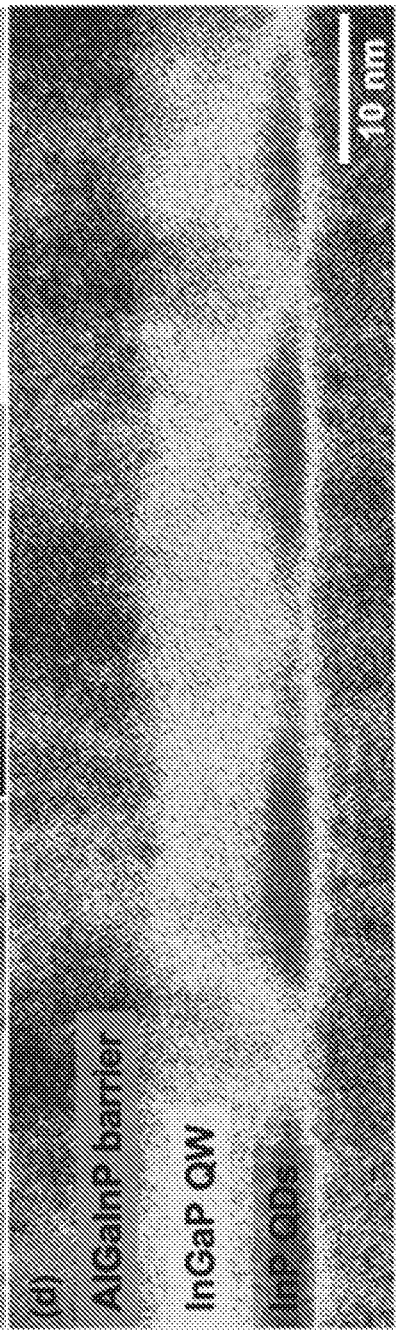

FIGS. 2(a) and 2(b) illustrate exemplary low-magnification (a) and high-magnification (b) XTEMs of an InP QD active region grown on GaAs/Si. FIG. 2(c) illustrates an exemplary XTEM of InP QDs grown on GaAs showing a nearly identical morphology, in the same scale as shown in FIG. 2(b). The XTEMs of FIGS. 2(a), 2(b), and 2(c) were taken using g=<220> two-beam conditions showing compressive strain fields around individual QDs. FIG. 2(d) illustrates an exemplary heat-map-style high-resolution HAADF-STEM image of an InP QD active region showing about 2.4 nm tall and about 20 nm wide InP QDs. A smooth and planar interface between the InGaP QW and AlGaInP barrier shows the recovery of planarity after capping InP QDs.

The TEM analyses of exemplary experimental InP QD PL structures grown on GaAs and GaAs/Si show that high-density InP QDs capped with a smooth InGaP QW did not exhibit nucleation of misfit dislocations around the active region. The g=<220> BF-XTEM image in FIG. 2(a) shows the exemplary InP QD PL structure grown on GaAs/Si, along with the top of the $GaAs_yP_{1-y}$ step-graded buffer used to grow GaAs on GaP/Si. FIGS. 2(b) and 2(c) show the active region of the PL structures with coherently strained InP QDs exhibiting mottled, dark strain contrast capped by an InGaP QW and surrounded on both sides by AlGaInP barriers. The strain field of the InP QDs appears similar on both GaAs/Si (FIG. 2(b)) and GaAs (FIG. 2(c)). In the figures, no misfit dislocations are observed around the active region. In contrast, misfit dislocations are an issue commonly observed with InAs DWELLs grown on Si. The BF-XTEM images also show a high buried QDD of about $1 \times 10^{11}$ cm$^{-2}$ measured over multiple images on both substrates. FIG. 2(d) shows an exemplary atomically resolved HAADF-STEM image of InP QDs on GaAs/Si revealing structural details that are difficult to discern in BF-XTEM. The smooth interface between the InGaP QW and upper AlGaInP barrier may confirm that a planar surface morphology recovered after the QD growth, consistent with in situ reflection high-energy electron diffraction observations. The mean height and diameter of the lens-shaped InP QDs nucleated on AlGaInP and buried by InGaP are about 2.4 nm and 20 nm, respectively, which is similar to InAs QDs capped with (In)GaAs.

Figure 3A:
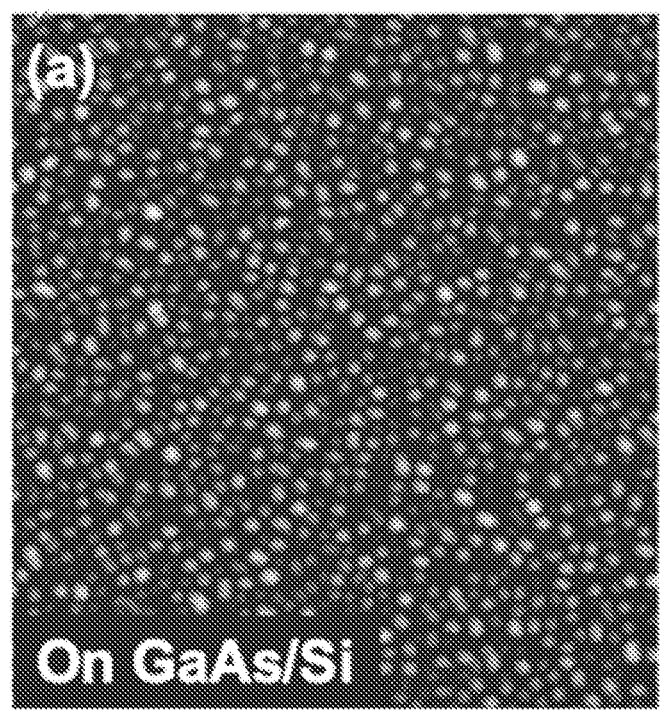
FIGS. 3(a) and 3(b) illustrates exemplary AFM images of 3 ML surface InP QDs grown on (a) GaAs/Si and (b) GaAs with a similar QDD of $1.3 \times 10^{11}$ cm$^{-2}$.
Figure 3B:
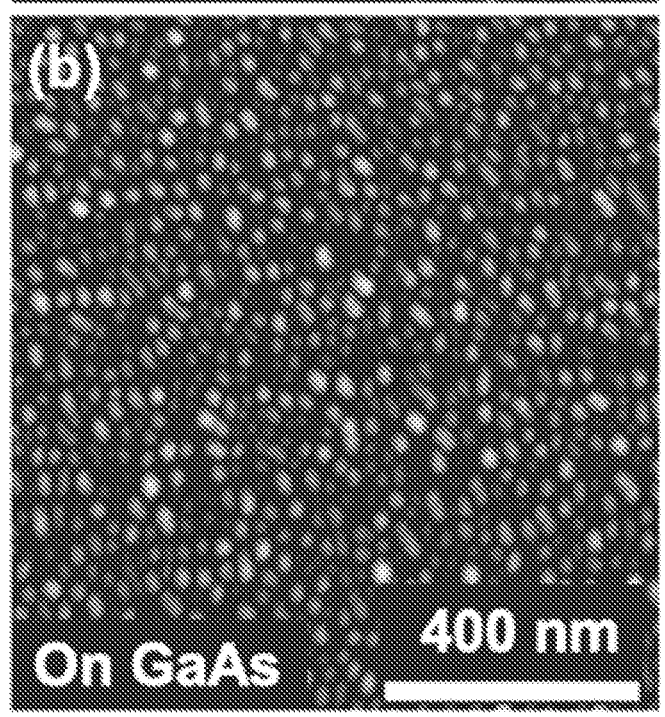

FIGS. 3(a) and 3(b) illustrates exemplary AFM images of 3 ML surface InP QDs grown on (a) GaAs/Si and (b) GaAs with a similar QDD of $1.3 \times 10^{11}$ cm$^{-2}$. Consistent with the high QDD seen in TEM, AFM shows a high surface QDD of about $1.3 \times 10^{11}$ cm$^{-2}$ with a bimodal height distribution on both GaAs/Si (FIG. 3(a)) and GaAs (FIG. 3(b)). The InP QDD disclosed herein is higher than in previous works and may result from nucleation on an Al-rich surface at a relatively low growth temperature (e.g., 480° C. for MBE vs 650° C. for MOVPE). The 20-30 nm lateral size of QDs on GaAs may be slightly larger than that of QDs on GaAs/Si due to the slight variation in the surface temperature on the two substrates. The 4-7 nm height of the surface QDs shown in FIG. 3 is 2-3× higher than that of the buried QDs observed in HAADF-STEM (FIG. 2(d)) due to mass transport upon capping, as seen with capped InAs QDs. FIG. 3 also shows a bimodal height distribution with distinct height peaks at 4 nm and 7 nm for InP/AlGaInP surface QDs on both GaAs and GaAs/Si, indicating that further growth optimization may be beneficial for a homogeneous QD morphology. The size of InP QDs grown as disclosed herein may be similar to InAs QDs grown on GaAs and Si, while their density may be significantly higher than the $5 \times 10^{10}$ cm$^{-2}$ that is typical for InAs QDs. A high QDD observed for InP QDs may be beneficial for efficient luminescence and defect-tolerance of visible QD-based emitters on Si.

Figure 4A:
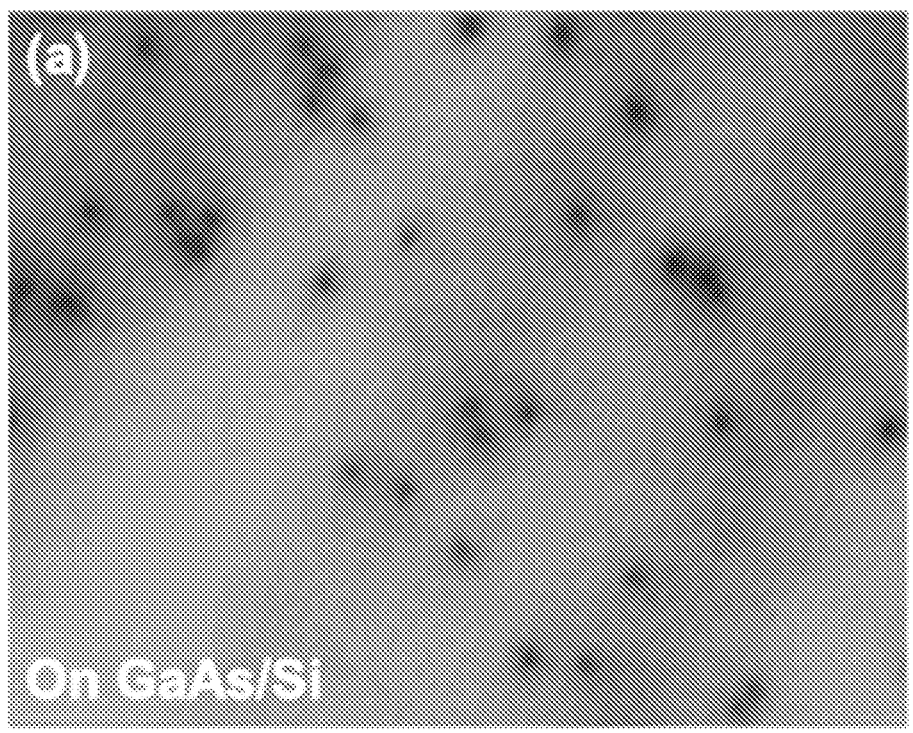
FIGS. 4(a) and 4(b) illustrate exemplary CL images of InP QDs grown on (a) GaAs/Si showing TDD=$3.3 \times 10^7$ cm$^{-2}$ with dark spots correlating with threading dislocations and (b) GaAs showing no dislocations over an area>150 μm².
Figure 4B:
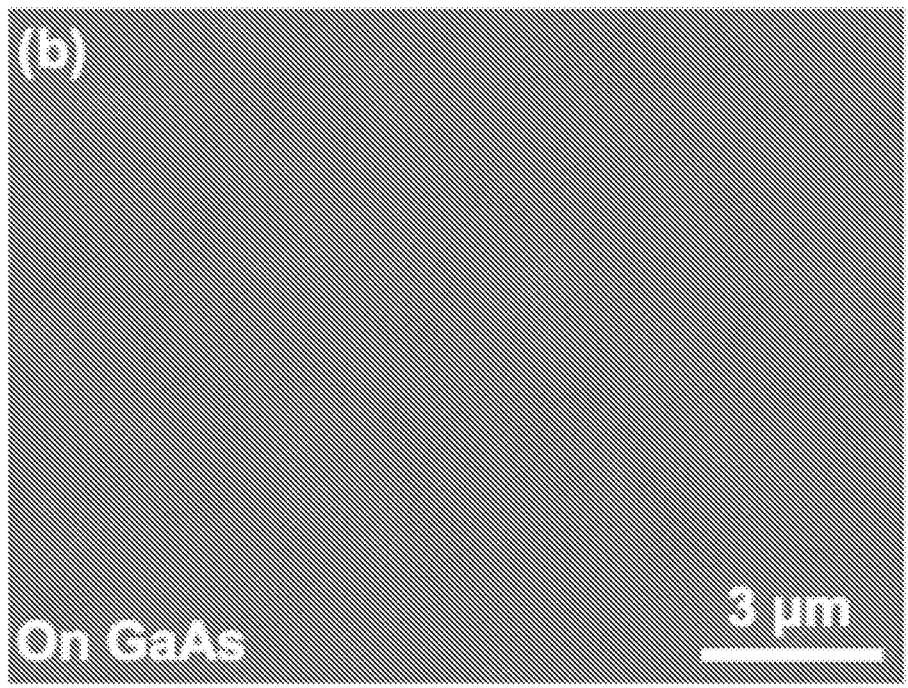

FIGS. 4(a) and 4(b) illustrate exemplary CL images of InP QDs grown on (a) GaAs/Si showing TDD=$3.3 \times 10^7$ cm$^{-2}$ with dark spots correlating with threading dislocations and (b) GaAs showing no dislocations over an area>150 μm². The panchromatic CL map of InP QDs grown on GaAs/Si in FIG. 4(a) shows a TDD of about $3.3 \times 10^7$ cm$^{-2}$, which is four orders of magnitude lower than the QDD. A similar TDD was verified using electron channeling contrast imaging (not shown). FIG. 4(b) shows the CL map of InP QDs grown on GaAs showing no dark spots, as expected. The GaAs wafers were specified at a TDD of $0.5$-$1.0 \times 10^4$ cm$^{-2}$. Consistent with BF-XTEM images (FIGS. 2(a)-2(c)), planar-view CL shows no misfit dislocations in the active region grown on GaAs/Si over a measured area>150 μm². The lack of misfit dislocations in FIG. 4(a) may result from the ability to perfectly lattice-match the InGaP QW to GaAs, which may not be possible in the InAs/InGaAs QDWELL system. Furthermore, the lattice mismatch of 3.7% between InP and GaAs is much smaller than the lattice mismatch of about 7% between InAs and GaAs, reducing the driving force for formation of misfit dislocations at the interface between the AlGaInP barrier and the InP wetting layer/QDs. Unlike previous work on InAs QDWELLs on Si, no glide of dislocations was observed in either CL or electron channeling contrast imaging of the light emitting devices described herein.

Figure 5:
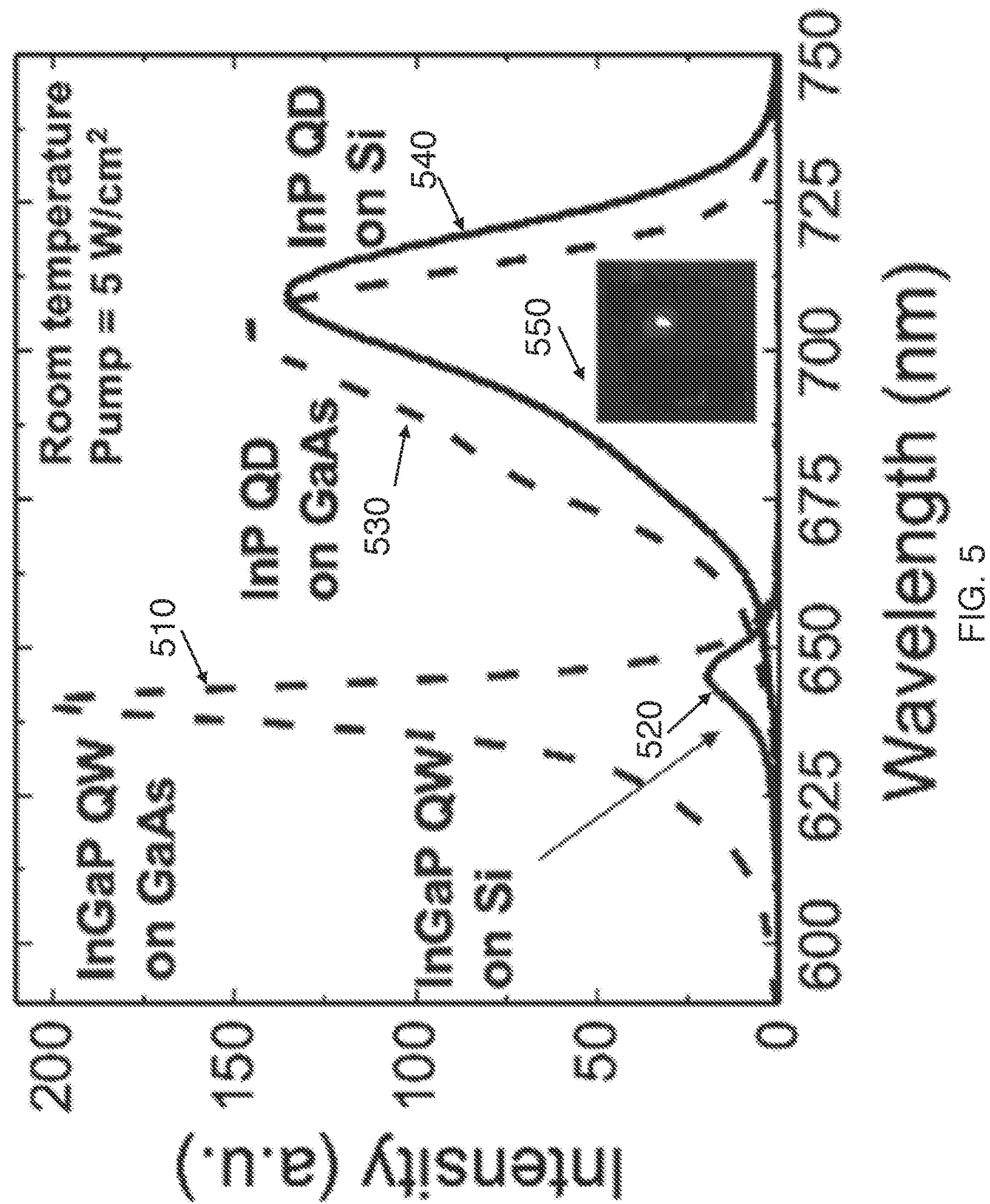
FIG. 5 illustrates exemplary measured room temperature PL spectra of sample InGaP QW and InP QDs grown on GaAs (dashed lines) and GaAs/Si (solid lines).

FIG. 5 illustrates exemplary measured room temperature PL spectra of sample InGaP QW and InP QDs grown on GaAs 510 (dashed lines) and GaAs/Si 520 (solid lines). The InGaP QW (with intensity peaks<about 660 nm wavelengths) grown on GaAs/Si shows about 9× degradation of PL intensity compared to the QW grown on GaAs. The InP QDs (with intensity peaks>about 660 nm wavelengths) show nearly identical PL intensity on both GaAs 530 and GaAs/Si 540. The inset 550 shows visible emission observed from InP QDs grown on GaAs/Si at pump power of about 5 W/cm². InP QDs grown on dislocated GaAs/Si may emit in the visible-NIR wavelength regime with PL intensity comparable to their counterparts grown on nearly dislocation-free GaAs substrates. Exemplary InGaP QW and InP QD PL samples described herein were experimentally subjected to rapid thermal annealing (RTA) at temperatures of about 700-1000° C. to remove point defects and increase the emission intensity. FIG. 5 shows that InGaP QWs on GaAs may emit at about 649 nm (1.91 eV), which may closely match the expected ground state emission wavelength with a full width at half maximum (FWHM) of 24 meV and an additional shoulder peak at 621 nm corresponding to the first excited state. InP QDs on GaAs may emit at 713 nm (1.74 eV) with a FWHM of 65 meV, similar to light emitting devices of previous works. The comparatively higher FWHM of InP QDs may be attributed to inhomogeneous broadening due to the distribution in QD size. An additional peak at 680 nm that is also observed may be due to the bimodal QD size distribution observed in the AFM scans. The PL spectra of QD and QW samples grown on GaAs/Si may be slightly redshifted from samples grown on GaAs due to the tensile strain arising from the thermal mismatch between the III and V layers and Si.

InGaP QWs grown on GaAs/Si may show a 9× reduction in PL intensity compared to QWs grown on GaAs. This reduction may be due to strong non-radiative recombination at threading dislocations. The integrated emission intensity of InP QDs on Si was measured in exemplary experimental samples to be about 8× higher than that of InGaP QWs on Si, which may demonstrate the viability of dislocation-tolerant, visible, phosphide-based light emitters on Si. The inset of FIG. 5 shows an exemplary measured intense, short-wavelength tail emitted by the InP QDs grown on Si, which may be visible to the naked eye. InP QDs may be dislocation-tolerant due to the large disparity between QDD and TDD, which may in turn lead to efficient carrier capture to the QDs. A reduced diffusion length of carriers due to lateral carrier confinement may also make InP QD active regions insensitive to dislocations compared to InGaP QW structures, in which carriers may freely diffuse to dislocations. Finally, differences in the energy level and capture cross section for dislocation-related traps in InP and InGaP may also partially account for the observed discrepancies in dislocation tolerance.

Exemplary experimental results from devices fabricated according to the present disclosure have demonstrated dislocation-tolerant InP QDs with comparable PL intensity on both GaAs and GaAs/Si. In contrast, InGaP QWs grown on GaAs/Si showed about 9× PL degradation compared to QWs grown on GaAs and about 8× lower intensity compared to InP QDs grown on Si. The dislocation tolerance of InP QDs may arise from the orders of magnitude higher QDD compared to the TDD, as well as impeded lateral diffusivity of carriers in the QD layer, similar to InAs QDs. However, in contrast to InAs QDs, the InP QD-based active regions described herein did not exhibit misfit dislocations in experimental measurements. This lack of measured misfit dislocations may potentially be due to the ability to lattice-match the InGaP QW used to cap the QDs to GaAs. The lack of misfit dislocations around the active region may be beneficial for improving the performance and reliability of InP QD based emitters, as the climb of misfit dislocations in InAs QD lasers on Si during device operation may significantly increase nonradiative recombination and operating current. The high density QDs demonstrated in the work described herein may be tolerant to the presence of threading dislocations. This tolerance may facilitate development and fabrication of efficient emitters on Si over a wider wavelength range than was previously demonstrated.

The experimentally demonstrated exemplary semiconductor lasers described below were grown in a Veeco Mod Gen II solid-source molecular beam epitaxy (MBE) system on GaAs (001) and GaAs/Si (001) without any intentional offcut. Relaxed GaAs was grown on GaP/Si (001) templates commercially available from NAsP$_{III-V}$ GmbH using a combination of thermal cycle annealing and dislocation filtering. The total thickness of the buffer layer was approximately 2.15 µm.

Figure 6:
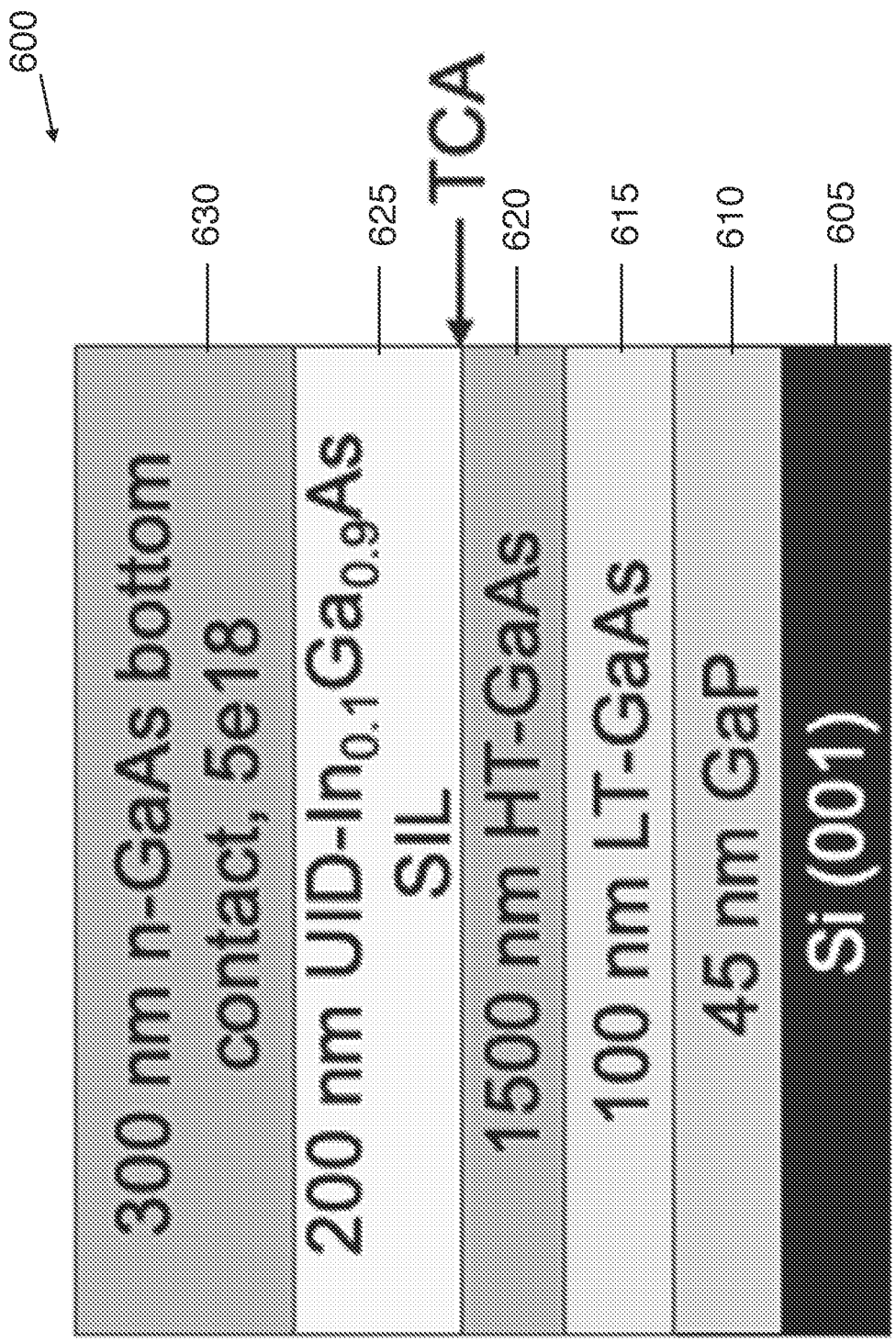
FIG. 6 illustrates an exemplary growth schematic of a relaxed GaAs/Si virtual substrate.

FIG. 6 illustrates an exemplary growth schematic of a relaxed GaAs/Si virtual substrate 600. The substrate 600 was used for growth of In$_{0.6}$Ga$_{0.4}$P SQW and InP MQD lasers. The substrate 600 was grown to include a 45 nm thick GaP layer 610 grown on a Si (001) substrate 605. Additional layers grown on top of the GaP layer 610 include a 100 nm thick LT-GaAs layer 615, a 1500 nm thick HT-GaAs layer 620, a 200 nm thick UID-In0.1Ga0.9As SIL layer 625, and a 300 nm thick n-GaAs bottom contact 630. Growth was initiated using 100 nm of low-temperature GaAs, grown at 0.1 µm/hr at 500° C., followed by 1500 nm of high-temperature 1 µm/hr GaAs at 580° C. Seven cycles of thermal cycle annealing from 400° C. to 700° C. were employed followed by 200 nm of In$_{0.1}$Ga$_{0.9}$As single insertion layer, grown at 500° C. The samples were capped with 300 nm of n-GaAs providing a surface for initiation of InGaP QW and InP MQD lasers.

All temperatures were measured using pyrometer. A typical MBE growth window for indium-containing phosphide layers was employed, with substrate temperature of 470° C., V/III ratio of 10-30, and growth rates of approximately 0.2-0.5 µm/hr. For RTA, the samples were placed on a Si wafer and covered with GaAs proximity wafer to prevent As desorption from the p-GaAs contact layer.

Broad-area lasers with ridge width of 40-100 µm were processed using standard photolithography and wet-etching. Both p- and n-contacts were formed on the epitaxial structure using Cr/Au as the p-metal and Ge/Au/Ni/Au as the n-metal. The metal contacts were annealed at 400° C. for 20 minutes after deposition using a tube furnace. Laser cavities of various lengths between 0.5 mm and 2 mm were formed by cleaving laser bars after substrate thinning and the facets were left uncoated. The laser bars were then mounted on copper blocks using electroplated In as the bonding layer for testing on a probe station. Broad-area laser diodes were tested using a temperature controlled stage, and the output power was measured using a thermopile detector. The laser spectra were collected using a precisely aligned ball lens with an optical fiber feeding into an optical spectrum analyzer.

A JEOL 2010F was used to conduct bright-field cross sectional transmission electron microscopy (BF-TEM) and an aberration-corrected JEOL 2200FS was used to conduct high-angle annular dark field (HAADF) scanning TEM (STEM) imaging, both at an accelerating voltage of 200 kV. The threading dislocation density of the GaAs/Si templates was measured using cathodoluminescence, performed in a JEOL 7000F analytical scanning electron microscope at an accelerating voltage of 5 kV using a Gatan MonoCL system. Both CL and TEM studies were conducted on as-grown samples before RTA.

Figure 7:
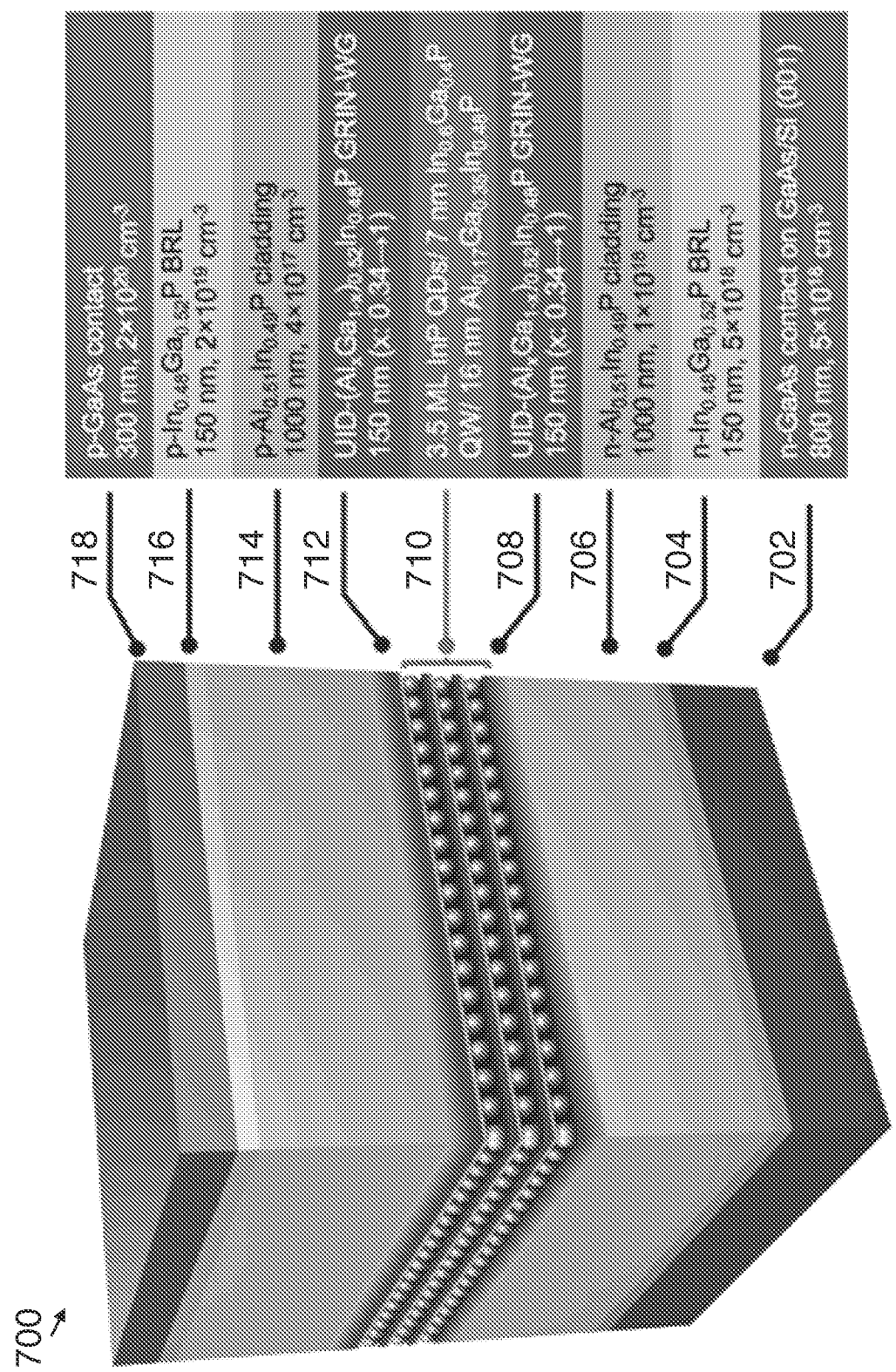
FIG. 7 illustrates a growth schematic of an exemplary InP MQD laser structure grown on GaAs/Si.

FIG. 7 illustrates a growth schematic of an exemplary InP MQD laser structure 700 grown on GaAs/Si. The laser structure 700 may include an n-GaAs contact layer 702 on GaAs/Si (001) as the bottom layer. The n-GaAs contact layer 702 may have a thickness of approximately 800 nm and a donor density of $5\times10^{18}$ cm$^{-3}$. Above the n-GaAs contact 702, an n-In$_{0.48}$Ga$_{0.52}$P BRL layer 704 having a thickness of approximately 150 nm and a donor density of $5\times10^{18}$ cm$^{-3}$ may be grown. Above the BRL layer 704, an n-Al0.51In0.49P cladding layer 706 having a thickness of approximately 1000 nm and a donor density of $1\times10^{18}$ cm$^{-3}$ may be grown. Above the cladding layer 706, a UID-(Al$_x$Ga$_{1-x}$)$_{0.52}$In$_{0.48}$ GRIN-WG layer 708 having a thickness of approximately 150 nm, over which x ranges from 0.34 to 1, may be grown. Above the GRIN-WG layer 708, a QDWELL structure 710 may include 3.5 ML InP QDs capped by 7 nm thick In$_{0.6}$Ga$_{0.4}$P QW and surrounded by 16 nm thick Al$_{0.17}$Ga$_{0.35}$In$_{0.48}$P spacer layers. The QDWELL structure 710 is shown repeated three times in the laser structure 700. Above the top QDWELL structure 710, a UID-(Al$_x$Ga$_{1-x}$)$_{0.52}$In$_{0.48}$ GRIN-WG layer 712 having a thickness of approximately 150 nm, over which x ranges from 0.34 to 1, may be grown. Above the GRIN-WG layer 712, a p-Al$_{0.51}$In$_{0.49}$P cladding layer 714 having a thickness of approximately 1000 nm and a donor density of $4\times10^{17}$ cm$^{-3}$ may be grown. Above the cladding layer 714, a p-In$_{0.48}$Ga$_{0.52}$P BRL layer 716 having a thickness of approximately 150 nm and a donor density of $2\times10^{19}$ cm$^{-3}$ may be grown. Above the BRL layer 716, a p-GaAs contact layer 718 having a thickness of approximately 300 nm and a donor density of $2\times10^{20}$ cm$^{-3}$ may be grown as the top layer. An InP SQW laser structure may be similar to the InP MQD laser structure 700, except the InP SQW laser structure would not include QDs and would only have one repeat of the active region.

The laser structure 700 includes an optical cavity having 1000 nm thick n-doped and p-doped AlInP cladding layers 706 and 714, respectively, and 150 nm thick continuous graded index waveguide (GRIN-WG) layers 708 and 712. In$_{0.48}$Ga$_{0.52}$P barrier reduction layers (BRLs) 704, 716 were grown between the respective GaAs contact layers 702, 718 and AlInP cladding layers 706, 714 to mitigate voltage drops resulting from band offsets. The cladding layers 706, 714, waveguide layers 708, 712, and BRLs 704, 716 were lattice-matched to GaAs, as confirmed by high-resolution x-ray diffraction.

The active region of a single QW (SQW) laser may include a compressively strained 7 nm In$_{0.6}$Ga$_{0.4}$P QW surrounded by 50 nm, 2.1 eV Al$_{0.17}$Ga$_{0.35}$In$_{0.48}$P (AlGaInP, hereafter) spacer layers, lattice-matched to GaAs. The active region of InP multiple quantum dot (MQD) lasers may utilize a QD in a well design (QDWELL structure 710) with 3.5 monolayers (MLs) InP QDs capped by a 7 nm In$_{0.6}$Ga$_{0.4}$P QW and surrounded by 16 nm AlGaInP spacer layers. The exemplary laser structure 700 includes a QDWELL structure 710 repeated three times in the InP MQD laser. The MQD active region may increase modal overlap with the gain region; in contrast, the majority of typical low-threshold In$_x$Ga$_{1-x}$P QW lasers utilize an SQW active region.

In the experiments disclosed herein, all laser structures underwent post-growth rapid thermal annealing (RTA) at 950° C. for 1 s to improve the optical quality of the active region prior to fabrication of uncoated, broad-area lasers. RTA may have a beneficial effect on both photoluminescence (PL) and laser threshold characteristics. Laser testing was performed under CW injection with devices sitting on a temperature-controlled stage. No evidence of degradation was found over the time spent characterizing these devices.

Figure 8B:
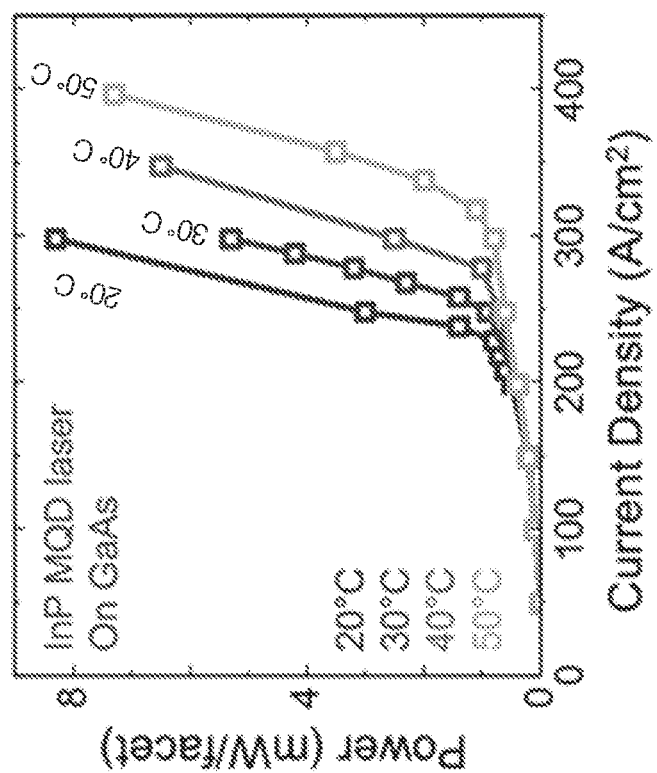
FIG. 8B illustrates a plot of exemplary L-I characteristics of an InP MQD laser on GaAs showing high-temperature operation up to 50° C.
Figure 8A:
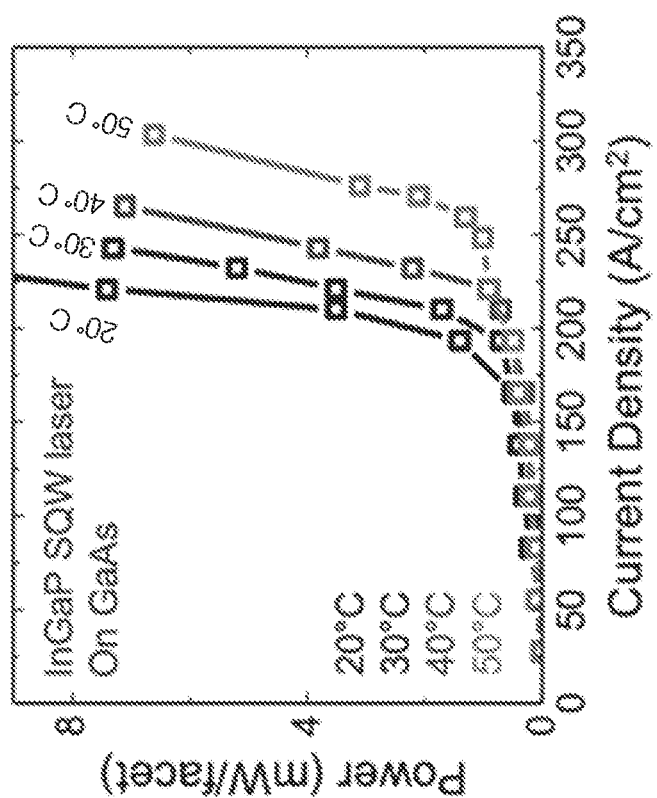
FIG. 8A illustrates a plot of exemplary L-I characteristics of an $In_{0.6}Ga_{0.4}P$ SQW laser on GaAs showing high-temperature operation up to 50° C.

FIG. 8A illustrates a plot of exemplary L-I characteristics of an In$_{0.6}$Ga$_{0.4}$P SQW laser on GaAs showing high-temperature operation up to 50° C. FIG. 8B illustrates a plot of exemplary L-I characteristics of an InP MQD laser on GaAs showing high-temperature operation up to 50° C. InGaP SQW lasers on GaAs may operate under CW at an elevated temperature of 50° C. with a characteristic temperature of 87 K. A threshold current density $J_{th}$ of approximately 250 A/cm2 may be observed at 50° C. for InGaP SQW lasers indicating low optical loss and carrier leakage in the lasers on GaAs. Similar to InGaP SQW lasers on GaAs, InP MQD lasers on GaAs may operate under CW at an elevated temperature of 50° C. with a characteristic temperature of 88 K. The first high-temperature CW operation of InP MQD lasers are disclosed herein using the advantages of RTA for point defect and graded index waveguide design for lower carrier leakage and high modal gain. Typical $J_{th}$ of 300-550 A/cm² may be observed for an $In_xGa_{1-x}P$ QW laser, with the lowest CW $J_{th}$ of 295 A/cm². The $In_{0.6}Ga_{0.4}P$ SQW laser on GaAs demonstrated and disclosed herein shows the lowest reported $J_{th}$ of approximately 170 A/cm² for red lasers. In addition, $In_{0.6}Ga_{0.4}P$ SQW laser on Si operates with a $J_{th}$ of approximately 550 A/cm², comparable to the best InGaP QW lasers on GaAs reported previously despite a TDD of $1\times10^7$ cm$^{-2}$. InP QD lasers reported previously operate with a $J_{th}$ of approximately 190-2300 A/cm² at room temperature under pulsed operation. Comparing the CW threshold of the exemplary InP MQD laser on GaAs with a $J_{th}$ of 230 A/cm² described elsewhere herein with previous reports establishes the near state-of-the-art material quality for the QD active regions, suitable for studying the effect of threading dislocations on the laser performance. The exemplary InP MQD laser on Si described herein may operate under CW at room temperature with a $J_{th}$ of 690 A/cm², comparable to the previous reports of high-performance InP MQD lasers on GaAs.

Figure 9:
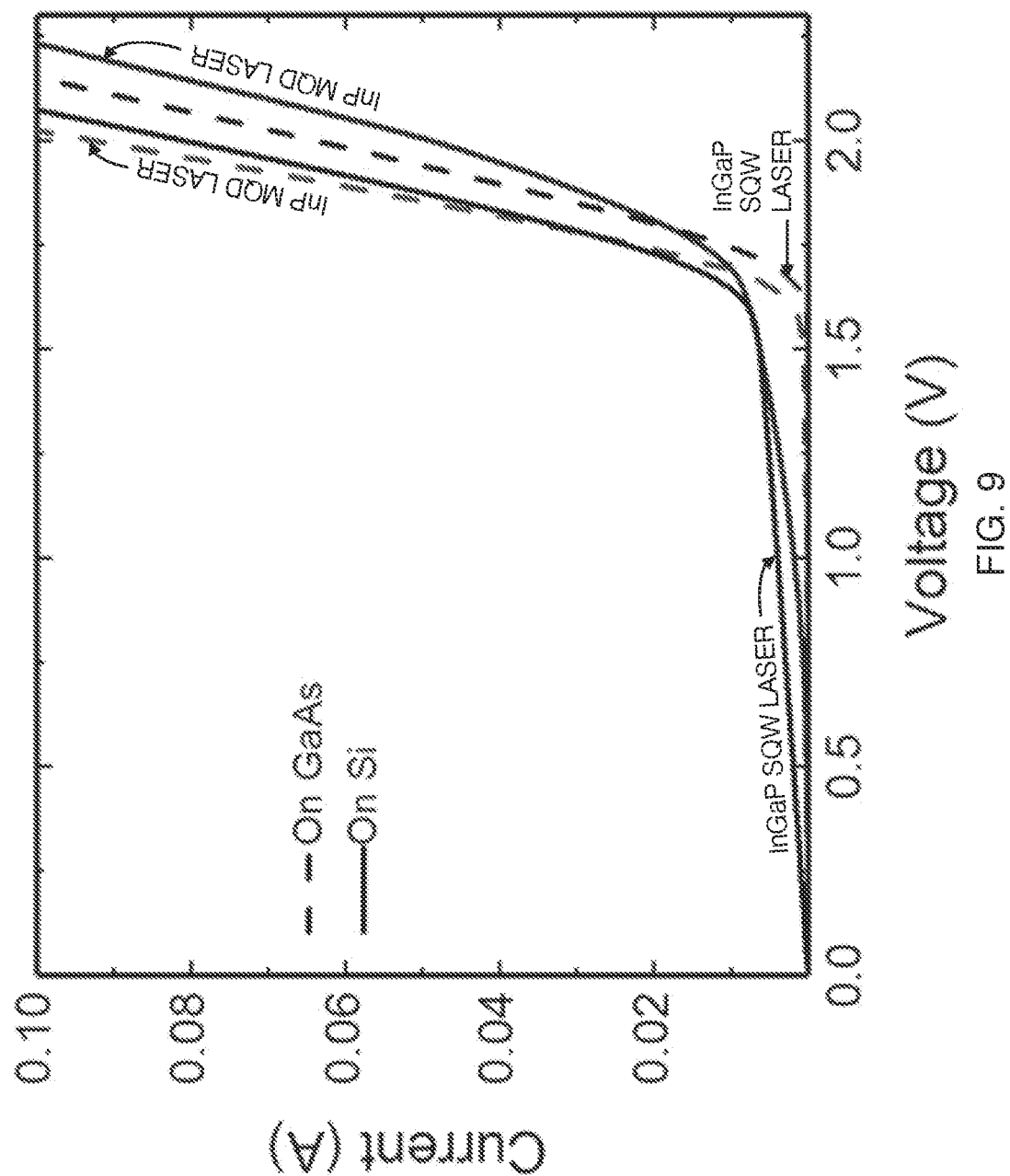
FIG. 9 illustrates a plot of exemplary I-V characteristics of $In_{0.6}Ga_{0.4}P$ SQW lasers on GaAs (dashed line) and Si (solid line) before mounting to Cu blocks with a series resistance of 4-10Ω measured across devices.

FIG. 9 illustrates a plot of exemplary I-V characteristics of $In_{0.6}Ga_{0.4}P$ SQW lasers on GaAs (dashed line) and Si (solid line) before mounting to Cu blocks with a series resistance of 4-10Ω measured across devices. We observed similar series resistance for InP QD lasers on GaAs (dashed line) and Si (solid line).

Figures 10A, 10B:
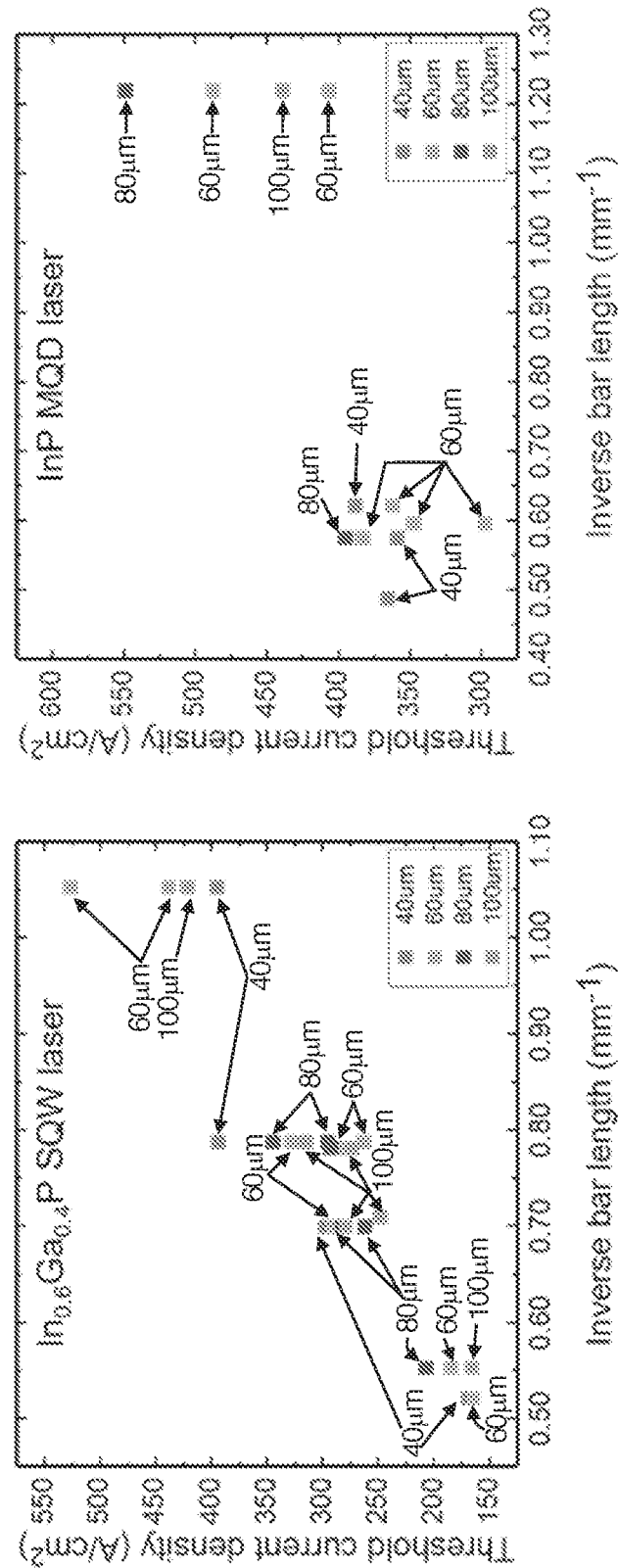
FIG. 10A illustrates a plot of exemplary threshold current density $J_{th}$ of $In_{0.6}Ga_{0.4}P$ SQW lasers vs inverse bar length for cavity lengths ranging from 40 μm to 100 μm.
FIG. 10B illustrates a plot of exemplary threshold current density $J_{th}$ of InP MQD lasers vs inverse bar length for cavity lengths ranging from 40 μm to 100 μm.

FIG. 10A illustrates a plot of exemplary threshold current density $J_{th}$ of $In_{0.6}Ga_{0.4}P$ SQW lasers vs inverse bar length for cavity lengths ranging from 40 μm to 100 μm. FIG. 10B illustrates a plot of exemplary threshold current density $J_{th}$ of InP MQD lasers vs inverse bar length for cavity lengths ranging from 40 μm to 100 μm. FIGS. 10A and 10B show higher $J_{th}$ with shorter cavity lengths and minimal effect of ridge width on $J_{th}$ of the lasers. The increase of $J_{th}$ may be due to increased mirror loss, while no such trend for $J_{th}$ is evident as a function of varying ridge width.

Figure 11:
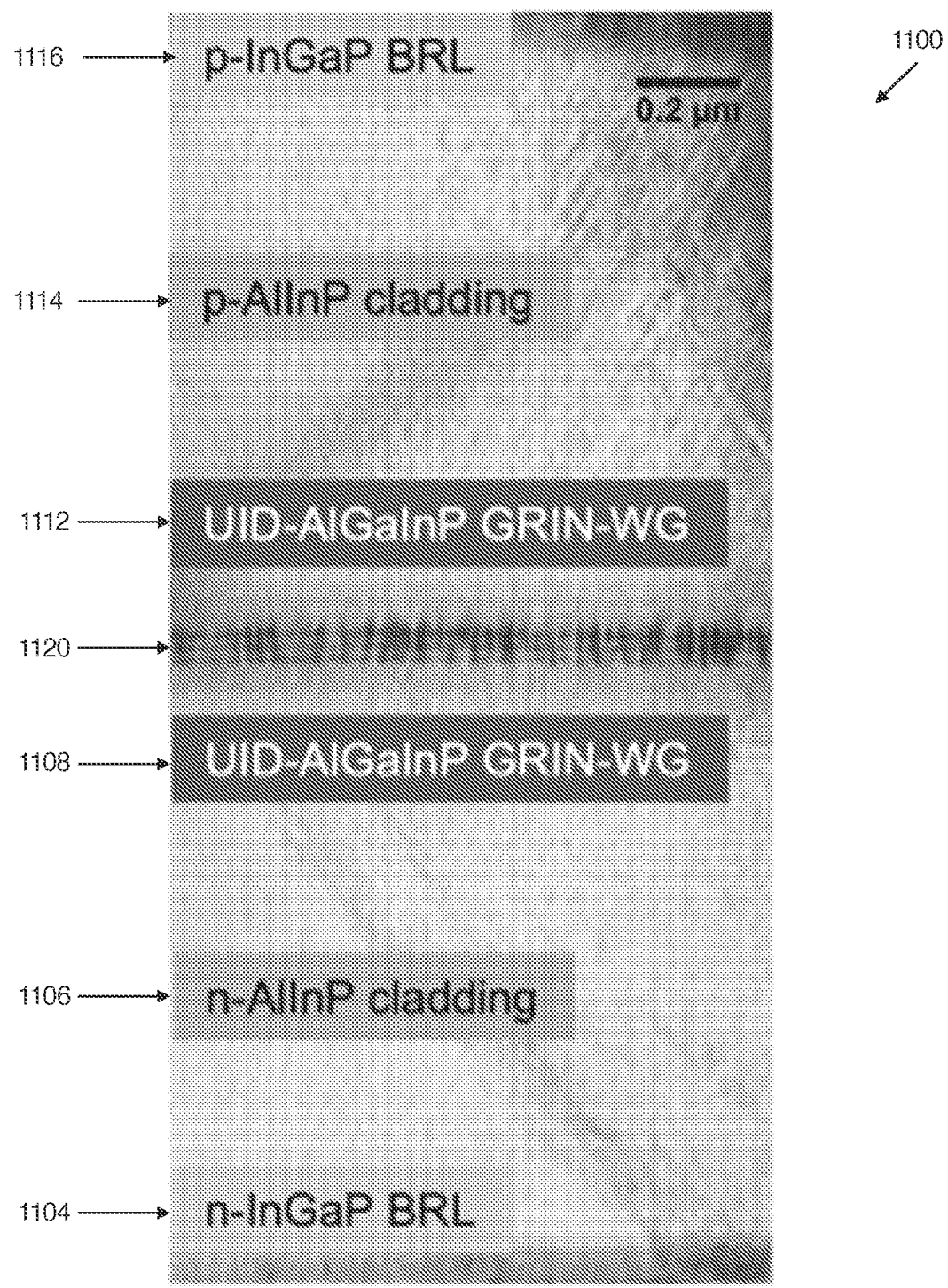
FIG. 11 illustrates a BF-TEM image of an exemplary InP MQD laser grown on GaAs/Si showing strain contrast around the InP QDs between the UID-AlGaInP GRIN-WG layers and cladding layers.

FIG. 11 illustrates a BF-TEM image 1100 of an exemplary InP MQD laser grown on GaAs/Si showing strain contrast 1120 around the InP QDs between the UID-AlGaInP GRIN-WG layers 1108 and 1112. The BF-TEM image 1100 also shows regions corresponding to an n-InGaP BRL layer 1104, n-AlInP cladding layer 1106, p-AlInP cladding layer 1114, and p-InGaP BRL layer 1116.

The bright-field transmission electron microscope (BF-TEM) image in FIG. 11 shows an entire exemplary InP MQD laser structure grown on GaAs/Si. The striated contrast throughout the device is common for ternary and quaternary AlGaInP alloys grown by MBE and results from weak phase separation during growth. The active region shows three layers of coherently strained InP QDs exhibiting a mottled, dark strain contrast, while the apparent absence of threading dislocations may indicate that the TDD in the active region is close to or below the detection limit of approximately $1\times10^7$ cm$^{-2}$. Misfit dislocations may not be observed in the active region, despite compressive strain present in both the InP QDs and $In_{0.6}Ga_{0.4}P$ QWs.

Figure 12:
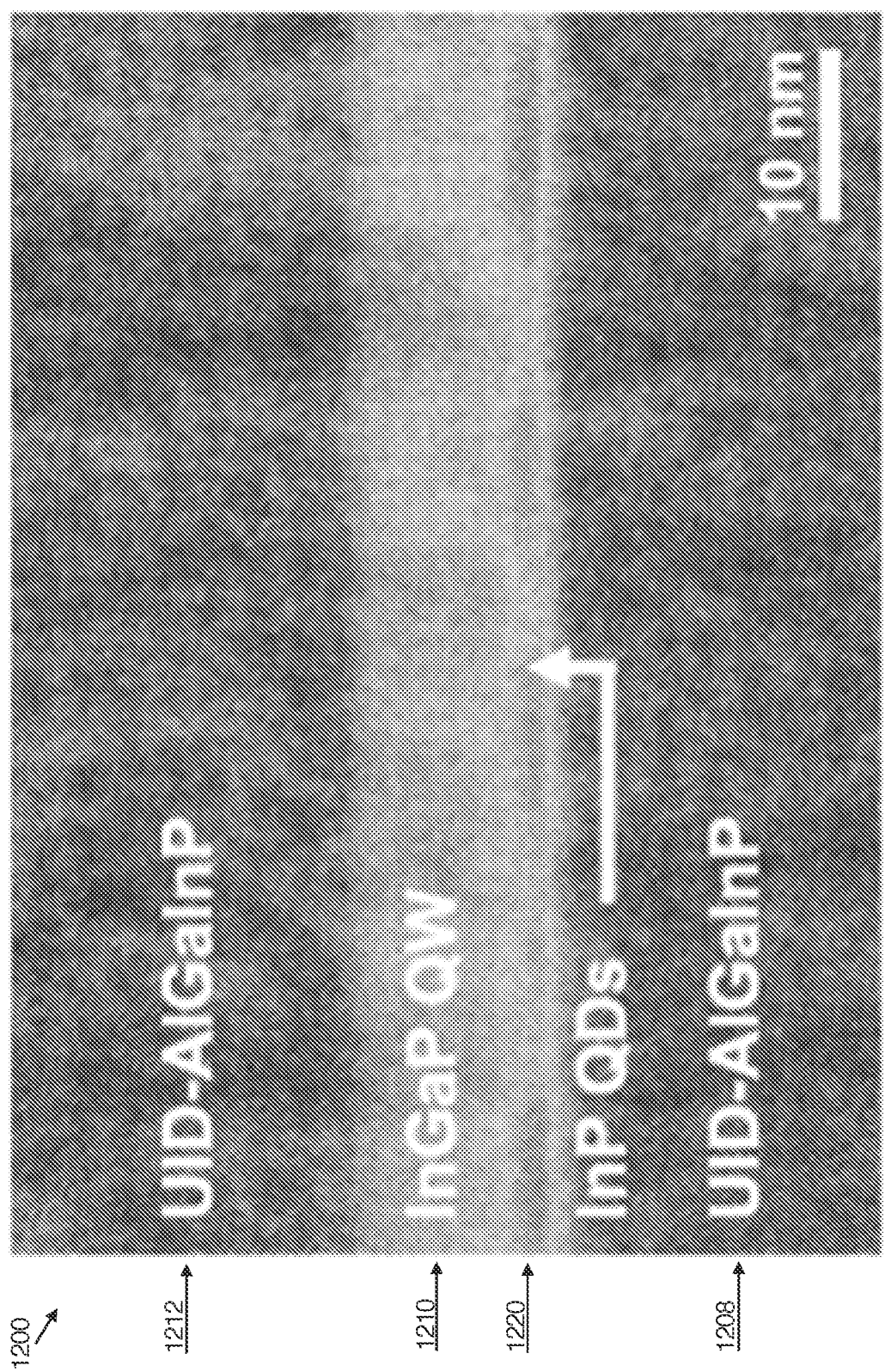
FIG. 12 illustrates an enhanced high-resolution HAADF-STEM image of an exemplary single InP QDWELL layer showing composition contrast from individual QDs.

FIG. 12 illustrates an enhanced high-resolution high-angle annular dark-field scanning TEM (HAADF-STEM) image 1200 of an exemplary single InP QDWELL layer 1210 showing composition contrast from individual QDs 1220. The HAADF-STEM image 1200 also shows regions corresponding to UID-AlGaInP layers 1208 and 1212. The HAADF-STEM image 1200 of a single QDWELL layer 1210 shows the composition contrast of individual InP QDs. The density of buried InP QDs may be calculated using BF-TEM as $>1\times10^{11}$ cm$^{-2}$.

Figure 13:
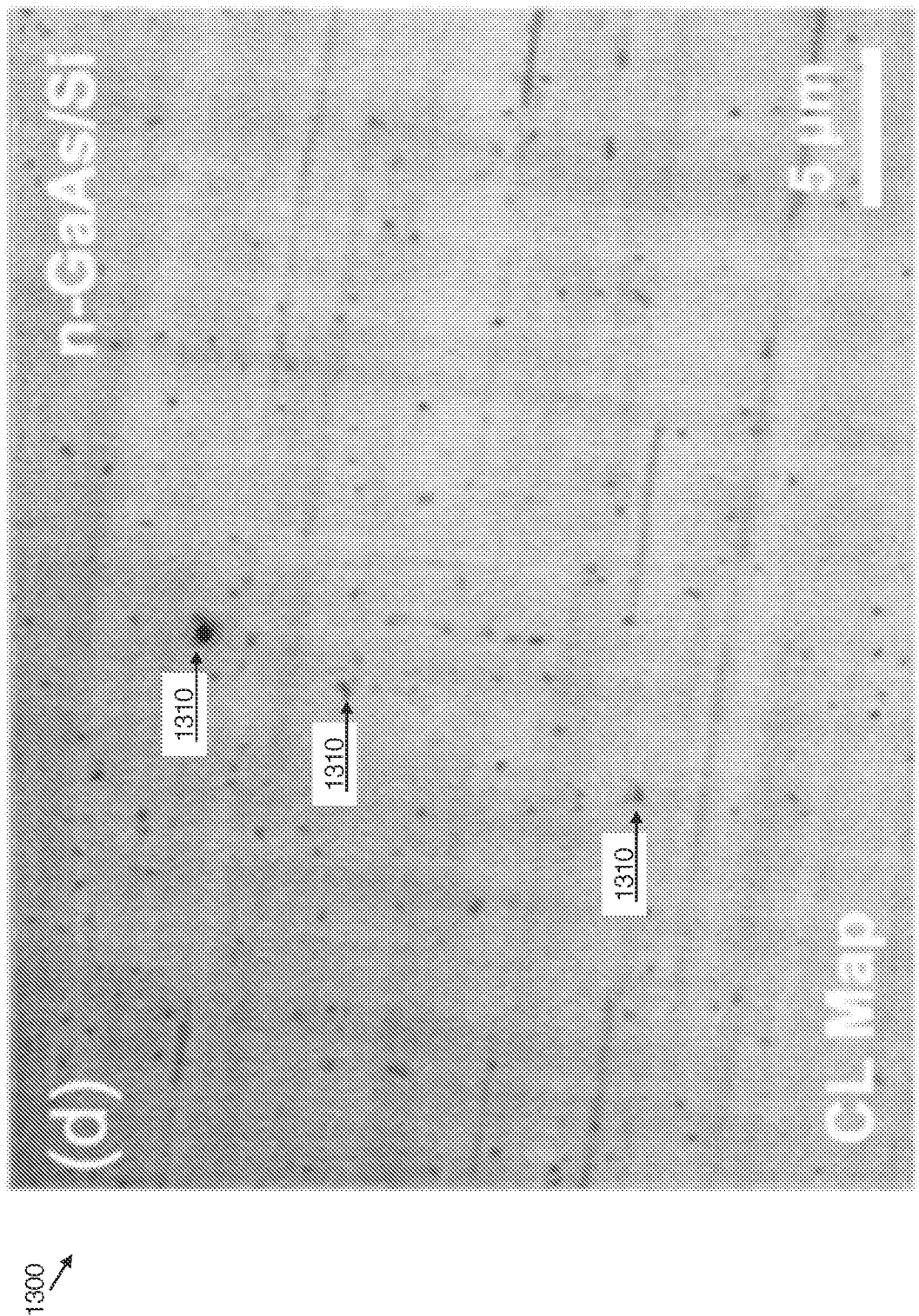
FIG. 13 illustrates a CL map of an exemplary n-GaAs/Si layer showing TDD of approximately $1 \times 10^7$ cm$^{-2}$ with dark spots correlating to threading dislocations.

FIG. 13 illustrates a panchromatic cathodoluminescence (CL) map 1300 of an exemplary n-GaAs/Si layer showing TDD of approximately $1\times10^7$ cm$^{-2}$ with dark spots 1310 correlating to threading dislocations. The CL map 1300 of the exemplary n-GaAs/Si virtual substrate used for the laser growth confirms the TDD value of approximately $1\times10^7$ cm$^{-2}$.

Figure 14A:
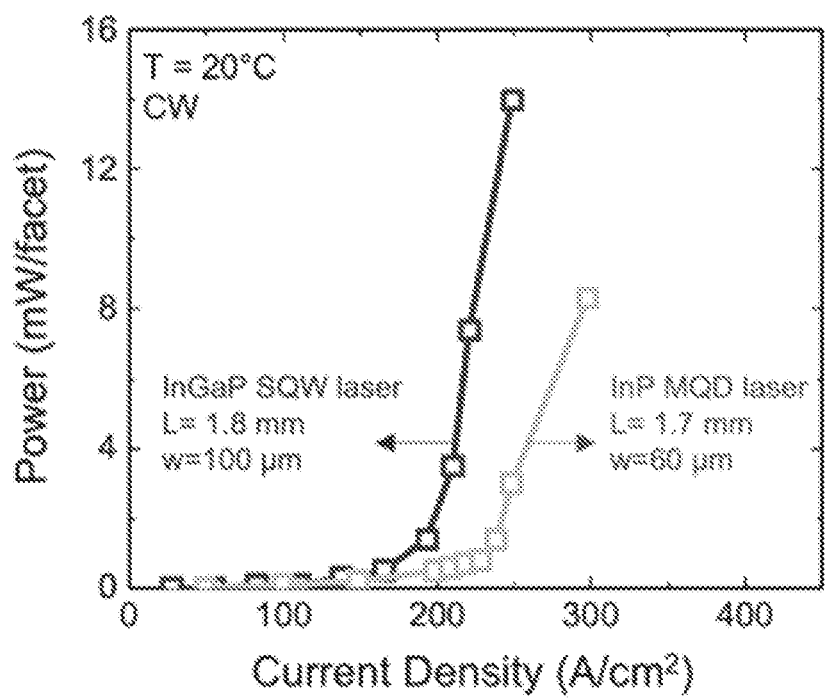
FIGS. 14A and 14B illustrate benchmark laser characteristics for broad-area devices grown on GaAs.
Figure 14B:
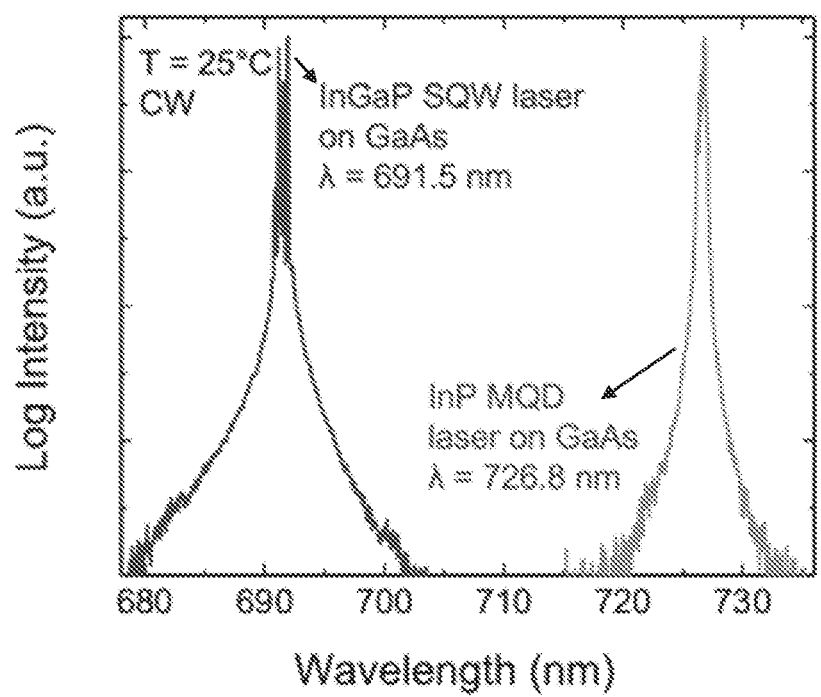

FIGS. 14A and 14B illustrate benchmark laser characteristics for broad-area devices grown on GaAs. FIG. 14A illustrates a plot of exemplary light intensity versus current density (L-I) curves for an $In_{0.6}Ga_{0.4}P$ SQW red laser having a 1.8 mm cavity length with 100 μm ridge, and an InP MQD green laser having a 1.7 mm cavity length with 60 μm ridge, tested under CW operation at a temperature of 20° C. The exemplary $In_{0.6}Ga_{0.4}P$ SQW red laser exhibited $J_{th}$=170 A/cm², and the exemplary InP MQD green laser exhibited $J_{th}$=230 A/cm². FIG. 14B illustrates a plot of exemplary semilogarithmic laser wavelength spectra for an $In_{0.6}Ga_{0.4}P$ SQW laser on GaAs having a central wavelength of 691.5 nm and an InP MQD laser having a central wavelength of 726.8 nm with multiple modes. The laser spectra were measured at room temperature (RT) of 25° C. under CW operation with driving currents of $1.7\times J_{th}$ for SQW lasers and $1.3\times J_{th}$ for MQD lasers.

A precursor towards demonstrating low-$J_{th}$ red lasers on silicon was to develop high-performance benchmark devices on native GaAs substrates. and FIG. 14A shows the characteristics of exemplary broad-area $In_{0.6}Ga_{0.4}P$ SQW and InP MQD lasers on GaAs tested under CW operation at 20° C. The $In_{0.6}Ga_{0.4}P$ SQW laser shows a low $J_{th}$ of 170 A/cm² with an output power of >10 mW, while the InP MQD laser exhibits a slightly higher $J_{th}$ of 230 A/cm² (77 A/cm² per QDWELL layer) due to its thicker active region. These are the lowest CW $J_{th}$ values on GaAs (001) that we are aware of. FIG. 14B shows that the exemplary $In_{0.6}Ga_{0.4}P$ SQW laser emits at 691.5 nm and the exemplary InP MQD laser emits in the far-red regime at 726.8 nm. Both of these lasers exhibit multiple transverse and longitudinal modes, as expected for broad-area lasers. Variations in cavity width over a range of 40-100 μm had no systematic effect on the $J_{th}$ or output power of the lasers described herein. The ultralow CW $J_{th}$ of the exemplary $In_{0.6}Ga_{0.4}P$ SQW and InP MQD lasers on GaAs establishes that their material quality may be at or near state-of-the-art values and facilitates observation of the performance of the exemplary lasers on silicon without the deleterious point defects that have been previously reported in MBE-grown phosphides.

Figure 15A:
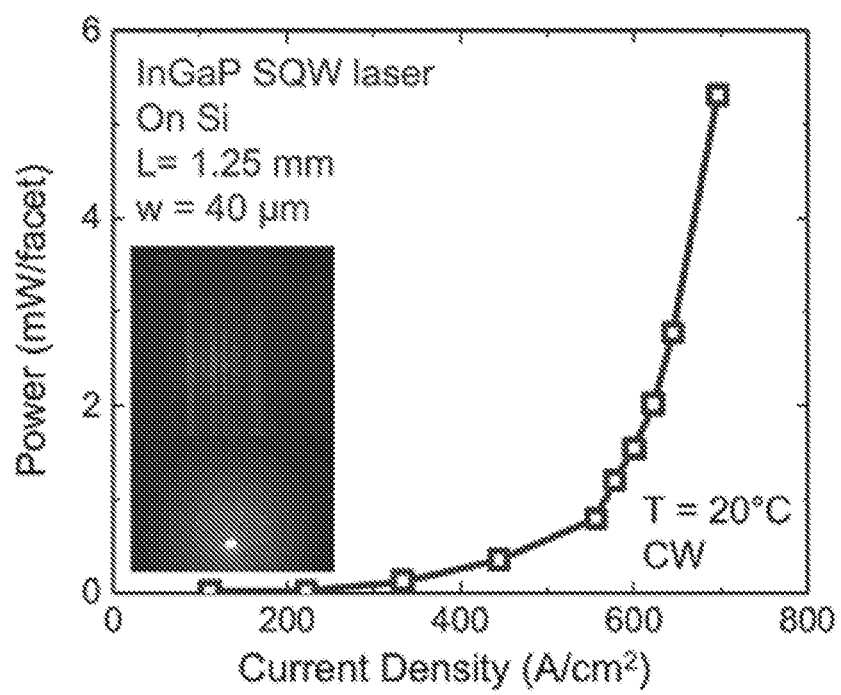
FIG. 15A illustrates a plot of an exemplary L-I curve for an $In_{0.6}Ga_{0.4}P$ SQW laser on GaAs/Si (001) with a cavity length of 1.25 mm and ridge width of 40 mm under CW operation at a temperature of 20° C. with $J_{th}$=550 A/cm².
Figure 15B:
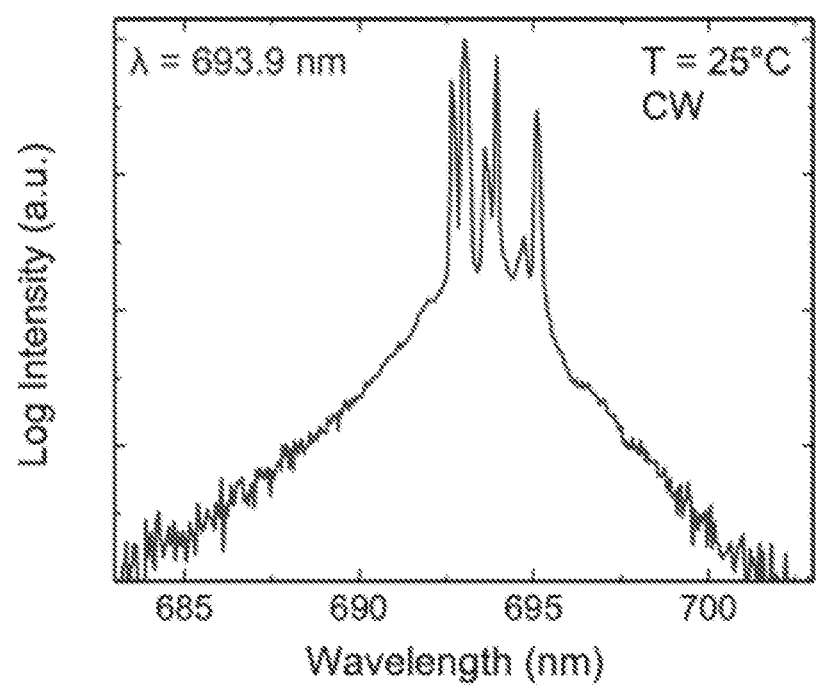
FIG. 15B illustrates a plot of an exemplary semilogarithmic wavelength spectra of an In0.6Ga0.4P SQW laser on Si operating at a driving current of 1.6×Jth, measured at room temperature under CW operation.

FIG. 15A illustrates a plot of an exemplary L-I curve for an $In_{0.6}Ga_{0.4}P$ SQW laser on GaAs/Si (001) with a cavity length of 1.25 mm and ridge width of 40 mm under CW operation at a temperature of 20° C. with $J_{th}$=550 A/cm². Inset in FIG. 15A is an image of an exemplary $In_{0.6}Ga_{0.4}P$ SQW laser on Si lasing with output power>5 mW projected on a wall approximately 50 cm away from the device under test. FIG. 15B illustrates a plot of an exemplary semilogarithmic wavelength spectra of an $In_{0.6}Ga_{0.4}P$ SQW laser on Si operating at a driving current of $1.6×J_{th}$, measured at room temperature under CW operation. FIG. 15B shows that the exemplary $In_{0.6}Ga_{0.4}P$ SQW laser on Si shows multiple mode emission centered at a wavelength of 693.9 nm. $In_{0.6}Ga_{0.4}P$ SQW lasers on Si (001) may exhibit a CW $J_{th}$ of approximately 550 A/cm², which is about 3× lower than previously reported pulsed devices on offcut Si. The inset of FIG. 15A shows an image of the laser (cavity length=1.25 mm, ridge width=40 μm) located at the bottom/foreground operating at approximately 5 mW output power with the far-field pattern projected onto a wall, approximately 50 cm from the device under test. The dark/bright vertical stripes in the far-field may result from diffraction effects in the elliptical emission pattern. The exemplary SQW laser on Si (001) emits with multiple modes centered at 693.9 nm as shown in FIG. 15B, slightly redshifted compared to the laser grown on GaAs. The redshift may be attributed to tensile strain arising from the thermal mismatch between III-V layers and S. Despite a TDD of $1×10^7$ cm⁻², $In_{0.6}Ga_{0.4}P$ SQW lasers show only a moderate increase of 3.2× in $J_{th}$ compared to SQW lasers on GaAs. Besides the impact of threading dislocations, the shorter cavity length (1.25 versus 1.8 mm) of the SQW laser on Si and the narrower ridge width (40 μm versus 100 μm) may be responsible for the increase in $J_{th}$. The relatively low $J_{th}$ of the exemplary $In_{0.6}Ga_{0.4}P$ SQW lasers on Si is noteworthy, considering that earlier work used GaAs/Si with a much lower TDD of $2×10^6$ cm⁻². Non-radiative recombination at point defects may be the most likely reason for the high $J_{th}$ values previously observed on both GaAs and Si, which in turn dominates the effects of threading dislocations. For comparison, $In_{0.15}Ga_{0.85}As$ QW lasers on GaAs/Si with emission at approximately 1 μm and TDD of approximately $1×10^8$ cm⁻² previously exhibited pulsed $J_{th}$ of 5.6 kA/cm², approximately 60× higher than their counterparts grown on GaAs (001). The exemplary $In_{0.6}Ga_{0.4}P$ SQW lasers on Si described herein may show a comparatively higher degree of tolerance to threading dislocations, which may result from the low carrier diffusivity in phosphides compared to arsenides. In contrast, $Ga_xIn_{1-x}As_ySb_{1-y}$ QW lasers grown on GaSb on Si emitting at 2.3 μm with a TDD=$1.4×10^8$ cm⁻² show only approximately 2× increase in $J_{th}$ compared to lasers grown on GaSb. There may be a complex interplay of bandgap energy and composition on the dislocation tolerance of III-V lasers.

Figure 16A:
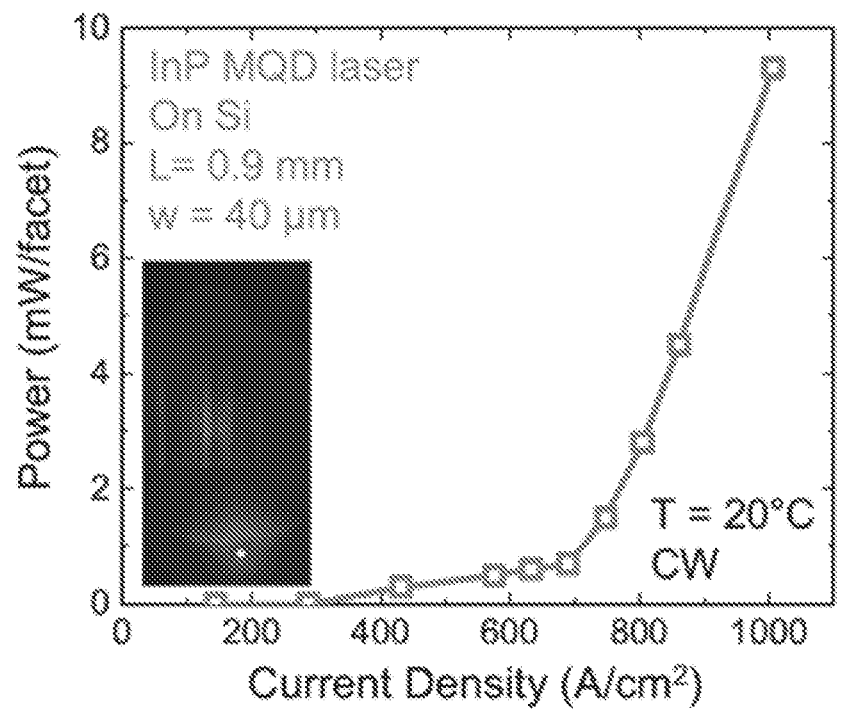
FIG. 16A illustrates a plot of an exemplary L-I curve for an InP MQD laser on GaAs/Si (001) with a cavity length of 0.9 mm and ridge width of 40 μm under CW operation at a temperature of 20° C. with $J_{th}$=690 A/cm².

FIG. 16A illustrates a plot of an exemplary L-I curve for an InP MQD laser on GaAs/Si (001) with a cavity length of 0.9 mm and ridge width of 40 μm under CW operation at a temperature of 20° C. with $J_{th}$=690 A/cm². FIG. 16A shows the RT, CW L-I characteristics of the first electrically injected InP MQD laser on GaAs/Si. $J_{th}$ of this laser is 690 A/cm² (230 AA/cm² per QDWELL layer). Inset in FIG. 16A is an image of an exemplary InP MQD laser on Si (cavity length=0.9 mm, ridge width=40 μm) lasing with output power of approximately 5 mW projected on a wall approximately 50 cm away from the device under test.

Figure 16B:
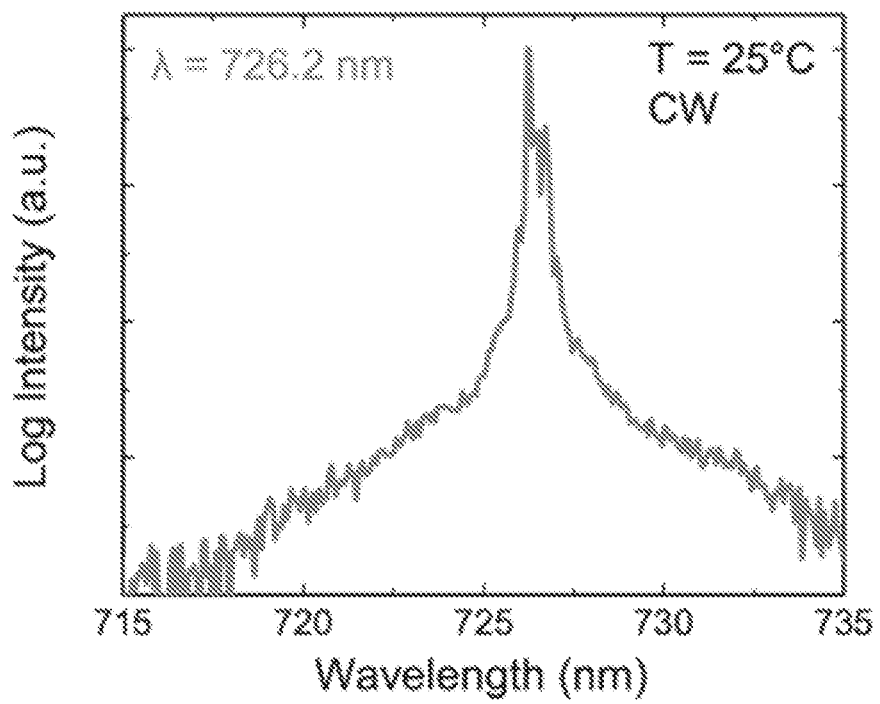
FIG. 16B illustrates a plot of an exemplary semilogarithmic wavelength spectra of an InP MQD laser on Si operating at a driving current of 1.6×$J_{th}$, measured at room temperature under CW operation.

FIG. 16B illustrates a plot of an exemplary semilogarithmic wavelength spectra of an InP MQD laser on Si operating at a driving current of $1.6×J_{th}$, measured at room temperature under CW operation. FIG. 16B shows that the exemplary InP MQD laser on Si shows multiple mode emission centered at a far-red wavelength regime at 726.2 nm. The InP MQD laser on Si wavelength spectra is nearly identical to the exemplary MQD lasers on GaAs described herein. Unlike the slightly different wavelengths of the SQW lasers described above, the lack of redshift here may be attributed to minor differences in QD growth on GaAs versus GaAs/Si. In addition to differences in growth, the emission wavelength of QD lasers may be affected by differences in mirror loss due to the varying cavity lengths on GaAs and GaAs/Si.

Figure 16C:
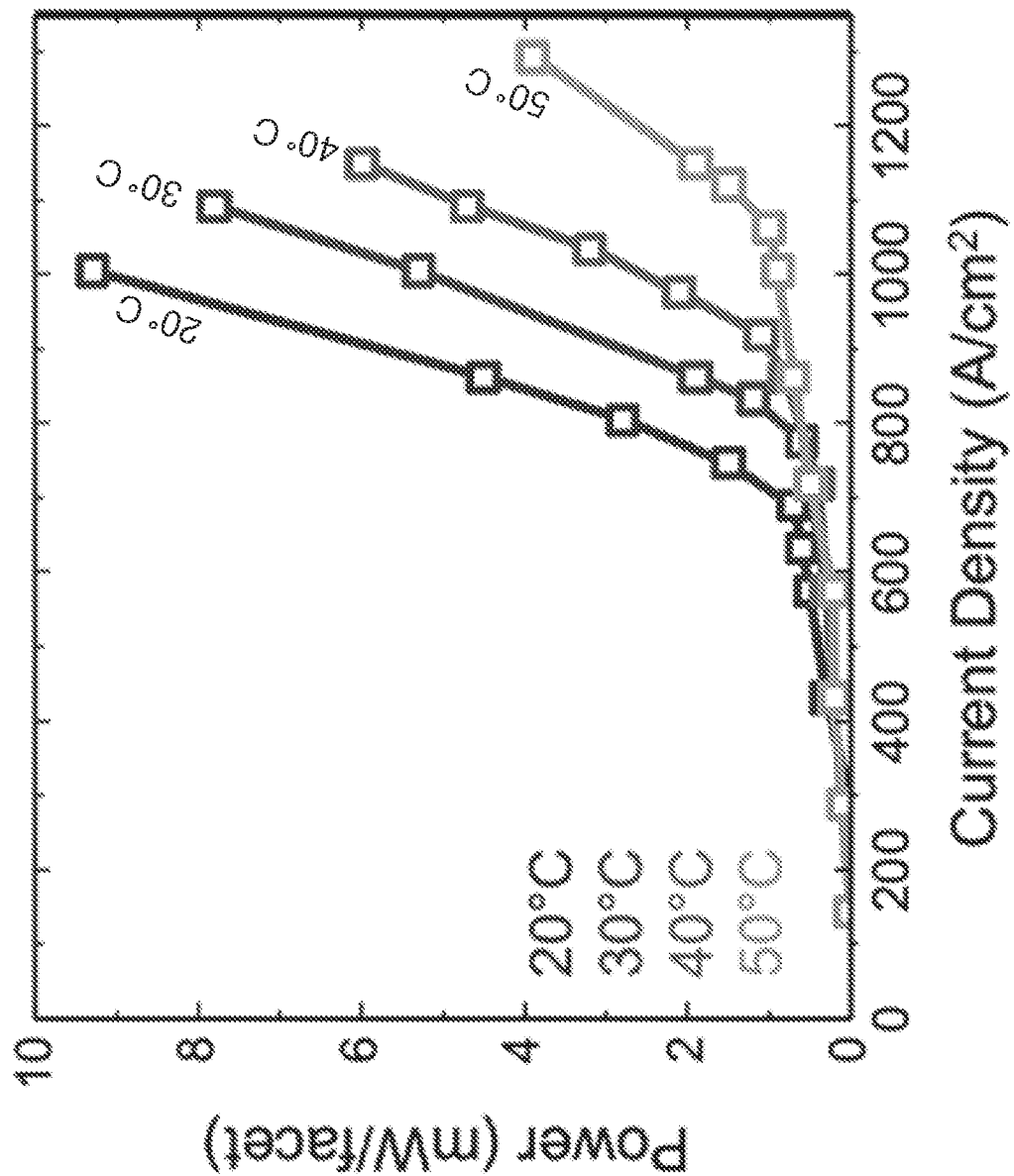
FIG. 16C illustrates a plot of an exemplary L-I curve for an InP MQD laser on Si under CW operation at elevated temperatures of 20° C. to 50° C. showing an increase in $J_{th}$ with characteristic temperature of 65 K.

FIG. 16C illustrates a plot of an exemplary L-I curve for an InP MQD laser on Si under CW operation at elevated temperatures of 20° C. to 50° C. showing an increase in $J_{th}$ with characteristic temperature of 65 K. FIG. 16C shows that $J_{th}$ of the InP MQD laser on Si increases from 690 A/cm² at 20° C. to 1063 A/cm² at 50° C. A characteristic temperature $T_o$ of 65 K for InP MQD lasers on Si was extracted, which is lower than the value of 88 K for lasers on GaAs. The lower $T_o$ on Si may indicate motivation for improved heat dissipation in the active region and further reduction of TDD. The InP MQD laser on GaAs/Si shows a $J_{th}$ increase of 3× compared to its counterpart grown on GaAs, which is comparable to the 2× increase typically seen in InAs MQD lasers on Si. Like QW lasers on Si, a part of the increase in $J_{th}$ may be attributed to the shorter cavity length and narrower ridges. But based on previous PL studies where InP QDs showed similar intensity on both GaAs and GaAs/Si, the carrier confinement offered by the QDs may be anticipated to confer some $J_{th}$ advantage for laser operation over the QWs. The high-level carrier injection inherent to laser operation may partly explain the qualitative discrepancy between the PL (taken at very low-level injection) and laser results. Optimized device design and processing may help further unveil the effects of threading dislocations on visible QW and QD lasers grown on Si.

Figure 17A:
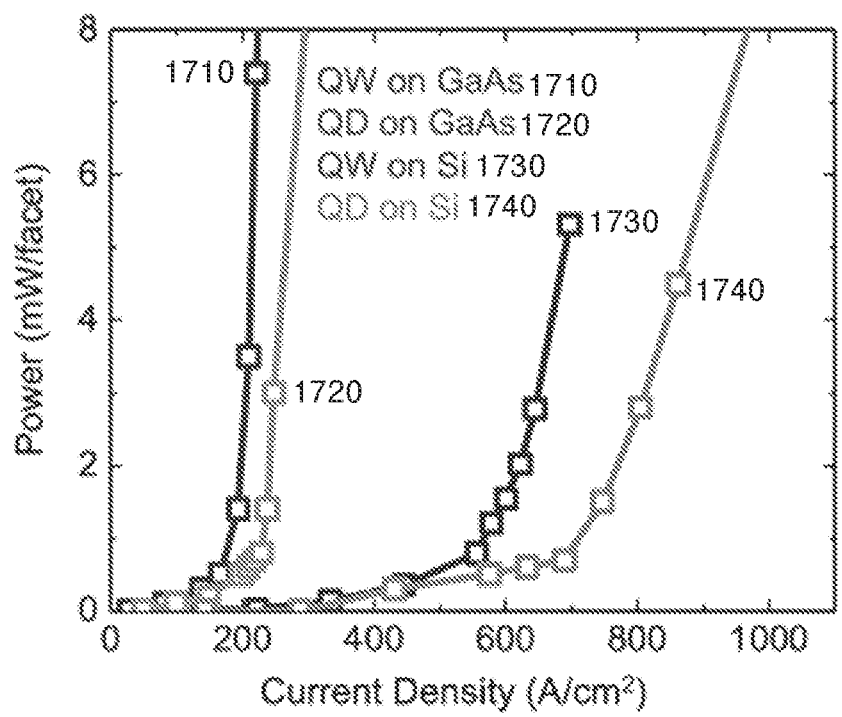
FIG. 17A illustrates a plot comparing exemplary L-I characteristics of $In_{0.6}Ga_{0.4}P$ SQW and InP MQD lasers on GaAs and GaAs/Si with both SQW and MQD lasers on Si showing a $J_{th}$ increase of approximately 3× compared to lasers on GaAs.

FIG. 17A illustrates a plot comparing exemplary L-I characteristics of $In_{0.6}Ga_{0.4}P$ SQW and InP MQD lasers on GaAs (1710, 1720) and GaAs/Si (1730, 1740) with both SQW (1730) and MQD (1740) lasers on Si showing a $J_{th}$ increase of approximately 3× compared to lasers on GaAs (1710, 1720). FIG. 17A shows that the exemplary red and far-red lasers achieved low-$J_{th}$ operation on both GaAs and GaAs/Si substrates. Despite a $J_{th}$ increase of approximately 3× caused by threading dislocations, both $In_{0.6}Ga_{0.4}P$ SQW (1730) and InP MQD (1740) lasers on Si show comparable $J_{th}$ to previously published red and far-red lasers grown on GaAs (1710, 1720). Using a GRIN design for optical and electrical confinement may provide a reduction of nonradiative recombination centers using RTA. The inherent low diffusivity of carriers in phosphides may be among the key factors for the exemplary low-$J_{th}$ lasers on Si substrates described herein.

Figure 17B:
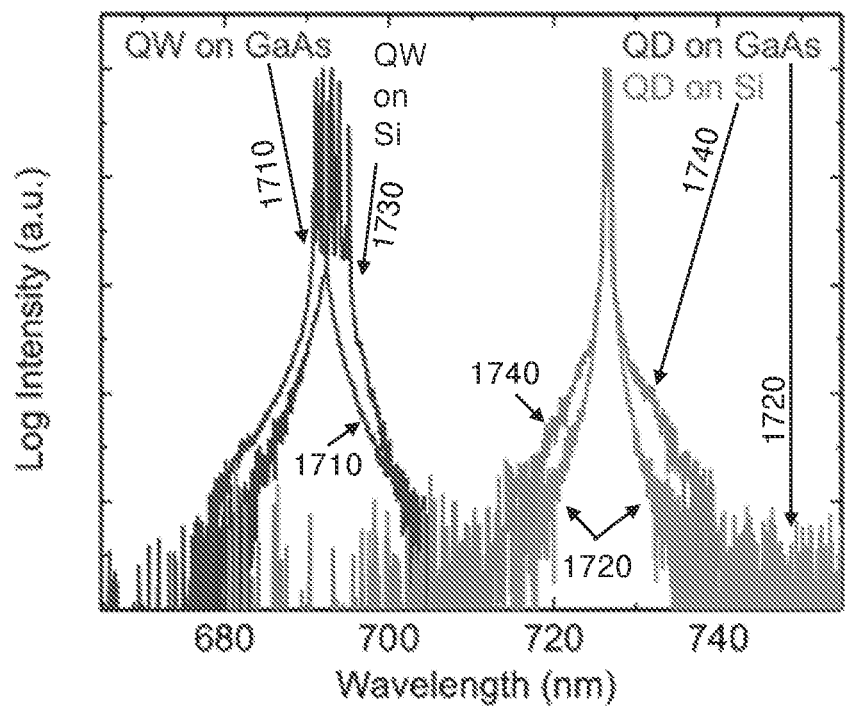
FIG. 17B illustrates a plot of wavelength spectra of $In_{0.6}Ga_{0.4}P$ SQW and InP MQD lasers on GaAs and GaAs/Si spanning 680 to 730 nm.

FIG. 17B illustrates a plot of wavelength spectra of $In_{0.6}Ga_{0.4}P$ SQW and InP MQD lasers on GaAs and GaAs/Si spanning 680 to 730 nm. The emission wavelength range may be tailored to a wide range of applications by utilizing tensile-strained $In_xGa_{1-x}P$ QWs for shorter wavelength emission and alloying InP QDs with arsenic for longer wavelength emission. The performance of both the SQW and MQD lasers may be further improved by reducing the TDD of GaAs/Si virtual substrates and exploring p-modulation doping in the QD active regions. The threshold voltage of the devices may be lowered by reduction of barriers to majority carriers and optimization of contact resistances. For example, the $In_{0.6}Ga_{0.4}P$ SQW lasers on both GaAs and Si may operate with a threshold voltage of 2.7 V, which may be higher than expected for a laser emitting at a photon energy of approximately 1.8 eV. Previously published lasers in this wavelength range have operated at voltages of 2.1-2.3 V, indicating that there is room for improvement. In addition to facet coating, lower $J_{th}$ operation of $In_{0.6}Ga_{0.4}P$ QW and InP MQD lasers on Si may be achieved with systematic improvements in facet formation, as well as longer cavity lengths.

Described herein are the first RT, CW, electrically injected red $In_{0.6}Ga_{0.4}P$ SQW and far-red InP MQD lasers on Si (001) with respective $J_{th}$ values of 550 A/cm$^2$ and 690 A/cm$^2$. The effect of dislocations on phosphide-based lasers and arsenide-based lasers on silicon may differ significantly, with arsenides showing stronger benefits in $J_{th}$ by switching from a QW to a QD active region. III-V lasers based on diverse active region designs, compositions, and bandgap energies may all behave differently when grown on silicon. Phosphide-based QW and QD lasers may offer high performance over a wide range of wavelengths from 630 to 800 nm, and the present disclosure establishes that such lasers may be grown on Si (001). Combined with $SiN_x$ waveguides, such short-wavelength lasers may open the intriguing possibility of direct integration with highly sensitive silicon photodetectors, circumventing the escalated dark current of epitaxial Ge/Si detectors. As epitaxial QD and QW lasers emitting at 1.3-2.3 µm may become increasingly established, red visible lasers according to the present disclosure may facilitate integrated photonics to expand its impact into areas such as on-chip biosensing and quantum computing.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

We claim:

1. A light emission source comprising:
   an active region having a plurality of InP quantum dots (QDs) epitaxially grown therein, the active region operable to convert electrical current into light emission;
   a first barrier layer grown below the active region;
   a second barrier layer grown on top of the active region; and
   a first carrier blocking layer grown below the first barrier layer.

2. The light emission source of claim 1, further comprising:
   a second carrier blocking layer grown on top of the second barrier layer.

3. The light emission source of claim 1, further comprising:
   a GaAs buffer layer grown below the first carrier blocking layer; and
   at least one of a GaAs or GaAs/Si layer grown below the GaAs buffer layer.

4. The light emission source of claim 3, wherein at least one of the GaAs or GaAs/Si layer is grown on a surface of a Si substrate, wherein the Si substrate comprises electrical circuitry for supplying electrical current to the light emission source.

5. The light emission source of claim 1, wherein the QDs comprise between two (2) and four (4), inclusive, monolayer InP QDs.

6. The light emission source of claim 1, wherein the active region comprises an InGaP quantum well (QW) that caps the InP QDs.

7. The light emission source of claim 1, wherein the QDs are disposed within an active region of an AlGaInP LED configured to emit light within a visible spectral range.

8. The light emission source of claim 1, wherein the QDs are disposed within an active region of an InP laser configured to emit light within a visible spectral range.

9. The light emission source of claim 2 further comprising:
   a GaAs capping layer grown above the second carrier blocking layer;
   an AlGaInP layer disposed above the GaAs capping layer; and
   a plurality of InP quantum dots (QDs) epitaxially grown on the AlGaInP layer.

10. A method of manufacturing a visible-wavelength light emission source comprising:
    epitaxially growing a GaAs buffer layer on at least one of a GaAs layer or a GaAs/Si layer;
    epitaxially growing a carrier blocking layer on top of the GaAs buffer layer;
    epitaxially growing a first barrier layer above the carrier blocking layer; and
    epitaxially growing a plurality of InP quantum dots within an active region operable to convert electrical current into light emission.

11. The method of claim 10, further comprising:
    epitaxially growing a second barrier layer on top of the active region.

12. The method of claim 11, further comprising:
    epitaxially growing a second carrier blocking layer on top of the second barrier layer.

13. The method of claim 12, further comprising:
    epitaxially growing a GaAs capping layer on top of the second carrier blocking layer.

14. The method of claim 13, further comprising:
    epitaxially growing an AlGaInP layer on top of the GaAs capping layer; and
    epitaxially growing a plurality of InP QDs on top of the AlGaInP layer.

15. The method of claim 10, further comprising growing the at least one of the GaAs or GaAs/Si layer on a surface of a Si substrate, wherein the Si substrate comprises electrical circuitry for supplying electrical current to the light emission source.

16. The method of claim 10, further comprising growing the QDs as between two (2) and four (4), inclusive, monolayer InP QDs.

17. The method of claim 10, wherein the active region comprises an InGaP quantum well (QW) that caps the InP QDs.

18. The method of claim 10, wherein the QDs are grown within an active region of an AlGaInP LED configured to emit light within a visible spectral range.

19. The method of claim 10, wherein the QDs are grown within an active region of an InP laser configured to emit light within a visible spectral range.

* * * * *